(12) United States Patent
Parkyn et al.

(10) Patent No.: US 6,603,243 B2
(45) Date of Patent: Aug. 5, 2003

(54) LED LIGHT SOURCE WITH FIELD-OF-VIEW-CONTROLLING OPTICS

(75) Inventors: William A. Parkyn, Lomita, CA (US); David G. Pelka, Los Angeles, CA (US)

(73) Assignee: Teledyne Technologies Incorporated, Los Angeles, CA (US)

(*) Notice: Subject to any disclaimer, the term of this patent is extended or adjusted under 35 U.S.C. 154(b) by 92 days.

(21) Appl. No.: 09/800,073

(22) Filed: Mar. 6, 2001

(65) Prior Publication Data

US 2002/0017844 A1 Feb. 14, 2002

Related U.S. Application Data

(60) Provisional application No. 60/187,458, filed on Mar. 6, 2000.

(51) Int. Cl.⁷ .............................. H01J 5/16; H01J 3/14; G02B 5/136; F21V 7/00; F21S 4/00
(52) U.S. Cl. ...................... 313/113; 313/114; 313/501; 313/512; 359/850; 359/853; 362/296; 362/297; 362/346; 362/347; 362/800
(58) Field of Search ................ 313/110–113, 116, 313/512, 501, 114; 362/231, 297, 328, 346, 347, 356, 800, 296; 359/850, 853

(56) References Cited

U.S. PATENT DOCUMENTS

| 1,153,446 A | 9/1915 | Roffy |
| 1,235,275 A | 7/1917 | Wood |
| 1,748,057 A | 2/1930 | Arbuckle |

(List continued on next page.)

FOREIGN PATENT DOCUMENTS

| EP | 660 648 A1 | 6/1995 |
| EP | 733 850 A2 | 9/1996 |
| GB | 2 131 589 | 6/1984 |
| JP | 62175702 A | 8/1987 |
| JP | 63110403 A | 5/1988 |
| WO | WO 87/04230 | 7/1987 |
| WO | WO 98/21917 | 5/1998 |
| WO | WO 98/26212 | 6/1998 |
| WO | WO 99/06759 | 2/1999 |
| WO | WO 00/54340 | 9/2000 |

OTHER PUBLICATIONS

Arl Rabl et al., *Ideal concentrators for finite sources and restricted exit angles*, Applied Optics, vol. 15, No. 11, Nov. 1976, pp. 58–61.
D. Jenkins et al., *Integral design method for nonimaging concentrators*, J. Opt. Soc. Am. A, vol. 13, No. 10, Oct. 1996, pp. 2106–2116.
D. Jenkins et al., *Tailored Reflectors for Illumination*, Applied Optics, vol. 35, No. 10, Apr. 1996, pp. 1669–1672.
David Rotman, *Quantum Dot Com*, Technology Review, Jan./Feb. 2000, pp. 50–57.

(List continued on next page.)

*Primary Examiner*—David Martin
*Assistant Examiner*—Dameon E. Levi
(74) *Attorney, Agent, or Firm*—Kirkpatrick & Lockhart LLP

(57) ABSTRACT

Pixels for a large video display which employs solid-state emitters, such as colored light emitting diodes, as light source are formed by outfitting each colored solid state emitter within the pixel with an individually tailored miniature intensity-enhancing optical system. Each of these miniature optical systems comprises a set of four wide field-of-view Lambertian reflectors 34, a pair of narrow field-of-view Lambertian reflectors 36, and a beam-shaping lens 38. The miniature intensity-enhancing optical system can be specifically designed to restrict emission in the vertical field-of-view, while providing a Lambertian intensity dependence throughout an unrestricted horizontal view. For example, the field-of-view in the vertical direction may be limited to about ±30° while the field-of-view is about ±90° in the horizontal direction.

22 Claims, 15 Drawing Sheets

U.S. PATENT DOCUMENTS

| | | |
|---|---|---|
| 1,998,967 A | 4/1935 | Raynolds |
| 2,120,836 A | 6/1938 | Grimes |
| 2,255,819 A | 9/1941 | Salani |
| 3,821,590 A | 6/1974 | Kosman et al. |
| 3,890,497 A | 6/1975 | Rush |
| 3,934,148 A | 1/1976 | Collins |
| 3,957,351 A | 5/1976 | Stockwell |
| 4,114,592 A | 9/1978 | Winston |
| 4,128,332 A | 12/1978 | Rowe |
| 4,130,107 A | 12/1978 | Rabl et al. |
| 4,149,902 A | 4/1979 | Mauer et al. |
| 4,210,954 A | 7/1980 | Laser |
| 4,230,095 A | 10/1980 | Winston |
| 4,237,332 A | 12/1980 | Winston |
| 4,240,692 A | 12/1980 | Winston |
| 4,254,453 A | 3/1981 | Mouyard et al. |
| 4,262,206 A | 4/1981 | Viehmann |
| 4,274,127 A | 6/1981 | Beck et al. |
| 4,292,959 A | 10/1981 | Coburn, Jr. |
| 4,320,442 A | 3/1982 | McCamy |
| 4,359,265 A | 11/1982 | Winston |
| 4,379,613 A | 4/1983 | Coburn |
| 4,387,961 A | 6/1983 | Winston |
| 4,392,750 A | 7/1983 | Mettler |
| 4,422,135 A | 12/1983 | McCamy |
| 4,492,778 A | 1/1985 | Claussen et al. |
| 4,561,043 A | 12/1985 | Thompson |
| 4,661,649 A | 4/1987 | Reisfeld et al. |
| 4,733,332 A | 3/1988 | Yamashita et al. |
| 4,739,152 A | 4/1988 | Downs |
| 4,755,916 A | 7/1988 | Collins |
| 4,865,417 A | 9/1989 | Yamamoto Naohiro et al. |
| 4,941,723 A | 7/1990 | Sasada |
| 4,965,876 A | 10/1990 | Földi et al. |
| 4,985,809 A | 1/1991 | Matsui et al. |
| 5,040,098 A | 8/1991 | Tanaka et al. |
| 5,095,099 A | 3/1992 | Parkinson et al. |
| 5,128,846 A | 7/1992 | Mills et al. |
| 5,184,114 A | 2/1993 | Brown |
| 5,227,773 A | 7/1993 | Wu et al. |
| 5,260,957 A | 11/1993 | Hakimi et al. |
| 5,271,077 A | 12/1993 | Brockman et al. |
| 5,321,417 A * | 6/1994 | Voelzke et al. ............... 345/32 |
| 5,332,910 A | 7/1994 | Haraguchi et al. |
| 5,410,453 A | 4/1995 | Ruskouski |
| 5,432,876 A | 7/1995 | Appeldorn et al. |
| 5,481,637 A | 1/1996 | Whitehead |
| 5,502,623 A | 3/1996 | Brotz |
| 5,548,676 A | 8/1996 | Savage, Jr. |
| 5,586,013 A | 12/1996 | Winston et al. |
| 5,606,163 A | 2/1997 | Huston et al. |
| 5,659,643 A | 8/1997 | Appeldorn et al. |
| 5,677,972 A | 10/1997 | Popovich |
| 5,678,913 A | 10/1997 | Ishimaru et al. |
| 5,685,634 A * | 11/1997 | Mulligan ................... 362/237 |
| 5,704,708 A * | 1/1998 | Barson et al. ............. 362/238 |
| 5,709,453 A | 1/1998 | Krent et al. |
| 5,721,795 A | 2/1998 | Pelka |
| 5,757,557 A | 5/1998 | Medvedev et al. |
| 5,779,351 A * | 7/1998 | Erickson et al. ........... 362/241 |
| 5,806,955 A | 9/1998 | Parkyn, Jr. et al. |
| 5,813,753 A * | 9/1998 | Vriens et al. .............. 362/293 |
| 5,816,693 A | 10/1998 | Winston et al. |
| 5,878,070 A | 3/1999 | Ho et al. |
| 5,881,200 A | 3/1999 | Burt |
| 5,924,788 A | 7/1999 | Parkyn, Jr. |
| 5,949,581 A * | 9/1999 | Kurtenbach et al. ........ 359/621 |
| 5,980,063 A | 11/1999 | Ford et al. |
| 5,982,969 A | 11/1999 | Sugiyama et al. |
| 5,997,155 A * | 12/1999 | Ducharme et al. .......... 362/298 |
| 6,005,707 A | 12/1999 | Berggren et al. |
| 6,031,859 A | 2/2000 | Nambu |
| 6,095,673 A | 8/2000 | Goto et al. |
| 6,103,006 A | 8/2000 | DiPietro |
| 6,123,442 A | 9/2000 | Freier et al. |
| 6,257,737 B1 * | 7/2001 | Marshall et al. ............ 362/231 |
| 6,294,794 B1 | 9/2001 | Yoshimura et al. |
| 6,422,712 B1 | 7/2002 | Nousiainen et al. |
| 2002/0127224 A1 | 9/2002 | Chen |

OTHER PUBLICATIONS

G.E. Jabbour et al., *Aluminum Composite Cathodes A new Method for the Fabrication of Efficient and Bright Organic Light–emitting Devices*, Optics & Photonics News, Apr. 1999, pp. 25–27.

Hewlett Packard catalog, Super Flux LEDs Technical Data, (date unknown), 3 pages.

I.M. Bassett et al., *The collection of diffuse light onto an extended absorber*, Reprinted from Optical and Quantum Electronics, vol. 10, 1978, 2 pages.

Jose L. Álvarez et al., Paper on *RXI concentrator for 1000X photovoltaic energy conversion*.

Juan C. Minano et al., Paper on *New non–imaging designs: The RX and the RXI concentrators*.

K. H. Schmidt et al., *Size quantization effects in InAs self–assembled quantum dots*, Appl. Phys. Letter, vol. 70, No. 13, Mar. 31, 1997, pp. 1727–1729.

Keith Barnham et al., *Quantum–dot concentrator and thermodynamic model for the global redshift*, Applied Physics Letter, vol. 76, No. 9, Feb. 28, 2000, pp. 1197–1199.

LumiLeds Product Showcase http:/www.lumileds.com/producs.html Oct. 11, 2000, 4 pages.

LumiLeds Red LED Rail Designer Kit, (date unknown), 5 pages.

N. C. Greenham et al., *Charge separation and transport in conjugated–polymer/semiconductor–nanocrystal composites studied by photoluminescence quenching and photoconductivity*, Physical Review B, vol. 54, No. 24, Dec. 15, 1996, pp. 17 628–17 637.

Olga I. Micic et al., *Highly efficient band–edge emission from InP quantum dots*, Appl. Phys. Letter, vol. 68, No. 22, May 27, 1996, pp. 3150–3152.

R. Winston, *Selected Papers in Nonimaging Optics*, SPIE, vol. MS106, 1995.

Slides on third party presentation at Monterey Conference, date unknown, 10 pages.

T. Tokizaki et al., *Linear and nonlinear optical properties of CdSe microcrystallites in glasses*, Journal of Crystal Growth, vol. 117, Feb. 1992, pp. 603–607.

Tivoli escort lights, 19890, 10 pages.

Tivoli the light fantastic, (date unknown), 4 pages.

U.S. patent application Ser. No. 09/334,848 filed Jun. 10, 1999.

U.S. patent application Ser. No. 09/620,051 filed Jul. 20, 2000.

U.S. patent application Ser. No. 09/800,067 filed Mar. 6, 2001.

U.S. patent application Ser. No. 09/800,073 filed Mar. 6, 2001.

U.S. patent application Ser. No. 09/948,507 filed Sep. 6, 2001.

U.S. patent application Ser. No. 09/993,286 filed Nov. 14, 2001.

U.S. patent application Ser. No. 10/199,991 filed Jul. 18, 2002.

W.T. Welford et al., *High Collection Nonimaging Optics*, Academic Press, 1989.

W.T. Welford et al., Paper on *The Optics of Nonimaging Concentrators Light and Solar Energy* 1978, pp. 29–32.

William A. Parkyn, *Segmented illumination lenses for step-lighting and wall–washing*, (date unknown), 8 pages.

William A. Parkyn, *The design of illumination lenses via extrinsic differential geometry*, (date unknown), 9 pages.

* cited by examiner

LED LIGHT SOURCE WITH FIELD-OF-VIEW-CONTROLLING OPTICS

PRIORITY APPLICATION

This application claims priority under 35 U.S.C. §119(e) from U.S. Provisional Patent Application Ser. No. 60/187,458, filed Mar. 6, 2000.

BACKGROUND OF THE INVENTION

The present invention relates to light-emitting diode (LED) displays and, more specifically, to pixel designs for LED displays.

Large full-color displays for viewing video images in daylight have become increasingly common in the United States and Japan, for example, in sports stadiums and for advertisements on buildings. These large displays comprise hundreds of thousands of pixels that can be arranged in a similar fashion as those in conventional color televisions. Each pixel includes a red, green, and blue light-emitting diode (LED), because they can in combination produce all hues. The three colored diodes in a pixel comprise a triad and are situated in close proximity to each other in a single package, the triad-package. This close proximity ensures that they are not separately visible to viewers, who see only the hue the light-emitting diodes (LEDs) produce in combination. In prior art designs such as those manufactured by Nichia, each triad has a single bullet-lens associated therewith. The three different colored LEDs in an individual triad each emit radiation from a front face and from side faces, but typically with differing proportions of light therefrom. Emission is usually maximal when viewed at a direction normal, or nearly so, to the front face. This emission progressively diminishes when viewed from increasing angles away from said normal. Emission from at least two (typically the green and blue) of the three LEDs, however, falls off at a different rate from the other (i.e., the red). Typically, the red LED will be relatively brighter than the blue and green when viewed at an angle away from the normal. As a result, the display may provide proper color-rendition for a viewer located along the triad axis, but will have different hues for viewers situated at other angles.

Also, although the LED's radiate in a wide range of directions, the displays are typically viewed by an audience that is located within a vertically confined region, such that the audience views the displays from a limited range of vertical angles. Light emitted by the LED display at angles outside this range is wasted, since it does not reach any viewers. In addition, the display should have the same brightness at all viewing angles, a property of Lambertian emission. The display's luminous efficiency is maximized by Lambertian emission of the triads. The bullet-lens configuration of the prior art, however, is not an Lambertian emitter and instead provides reduced or excess off-angle brightness.

Thus, there is a need for an LED pixel comprising colored LEDs that fall off at substantially identical rates and that directs substantially all emission toward the viewing audience, in a Lambertian pattern of constant brightness whereby intensity falls off with the cosine of the viewing angle.

SUMMARY OF THE INVENTION

In one aspect of the invention, a color display comprises a plurality of pixels, each pixel comprising a plurality of light sources. Each of the light sources comprises a solid-state emitter that emits light of a color different from the other light sources. In addition, each of the light sources includes optics such that intensity variations with respect to view-angle are substantially the same as those of the other light sources.

In another aspect of the invention, a color display comprises a plurality of pixels each comprising a plurality of light sources, wherein the light sources each comprise a light-emitting diode and associated beam-shaping optics.

In yet another aspect of the invention, a color display comprises a plurality of pixels each comprising a plurality of substantially Lambertian sources. Each Lambertian source comprises a light-emitting diode that emits light of a color different from other of the Lambertian sources in the pixel. The Lambertian sources further include optics situated to receive light from the light-emitting diode and configured to redirect the light so as to produce the requisite Lambertian emission pattern.

In still another aspect of the invention, an apparatus comprises a light source that emits light for viewing at various angles, with substantially constant brightness. The light source comprises an LED and a Lambertianizing cup. The light-emitting diode is preferably rectangular. It has a front surface, a back surface opposite the front surface, and four side surfaces; the front surface and the four side surfaces emit light. The front surface and the four side surfaces intersect along four upper edges, respectively. The Lambertianizing cup comprises a bottom support surface and four reflecting surfaces, one facing each of the four side surfaces of the light-emitting diode. At least one opposed pair of the reflector surfaces is configured to provide a substantially cosine fall-off of light intensity for viewing angles in the plane they form with the normal to the front face. In one preferred embodiment, the reflector surfaces are cylindrical and lengthwise parallel to the edges of the front face of the LED. More particularly, the reflector surfaces substantially coincide with a locus of point intersecting an arc that is translated along a line parallel to the upper edge of each of the four sides of the LED. These reflector surfaces are specifically shaped to form non-imaging reflectors.

In another aspect of the invention, a non-imaging optical element comprises first and second reflectors positioned in spaced, facing relationship. Each reflector comprises a middle section and two end sections on opposite sides of the middle section. The middle section comprises a surface in the form of a parabolic cylinder with a line focus. Each end section comprises a surface that joins the surface of the middle section along a parabolic line. The surface of each end section is a paraboloid with a point focus proximate a respective end of the line focus of the middle section. The middle sections of the first and second reflectors form a compound parabolic concentrator trough, which together with the end sections of the reflectors provide beam-shaping optics for restricting beam divergence in one of two orthogonal directions. Preferably, this direction is the vertical direction.

In yet another aspect of the invention, beam-shaping optics for a light-emitting diode comprise first and second sets of reflectors and an optical element comprised of transmitting material. The first set of reflectors is positioned adjacent to sides of the light-emitting diode. The second set of reflectors is oriented to limit beam divergence of light from the light-emitting diode to a limited range of angles in one plane. Preferably, this plane is a vertical plane. The optical element comprised of transmitting material is positioned to receive light from the light-emitting diode and the first and second sets of reflectors. The sets of reflectors and transmitting material are oriented and configured to provide a substantially Lambertian fall-off for light intensity in both planes, but with a limited range of angles in one plane, preferably the vertical and a substantially Lambertian fall-off for light intensity in an orthogonal plane, preferably the horizontal, within a range of angles greater than the limited range of angles.

Another aspect of the invention comprises a method of manipulating an LED's light to provide Lambertian emission through a requisite range of viewing angles. The method includes the step of collecting light emitted from plural side surfaces of a light-emitting diode and redirecting the light so that it approximates the emission pattern of a single Lambertian surface. The divergence of collected light is reduced in a plane orthogonal to an opposing pair of the plural sides. The collected light is refracted after reducing the divergence.

Still another aspect of the invention comprises a method of shaping the output of a light-emitting diode having a front and a plurality of sides that emit light. This method includes the step of collecting light emitted from the sides and redirecting the light to simulate light produced by a single substantially Lambertian surface. In addition, reflectors are used to reduce the divergence of the beam in one direction, preferably the vertical, to a limited range of angles, while maintaining a substantially Lambertian fall-off within a substantial portion of said limited range.

DETAILED DESCRIPTION OF THE PREFERRED EMBODIMENT

Figure 1:
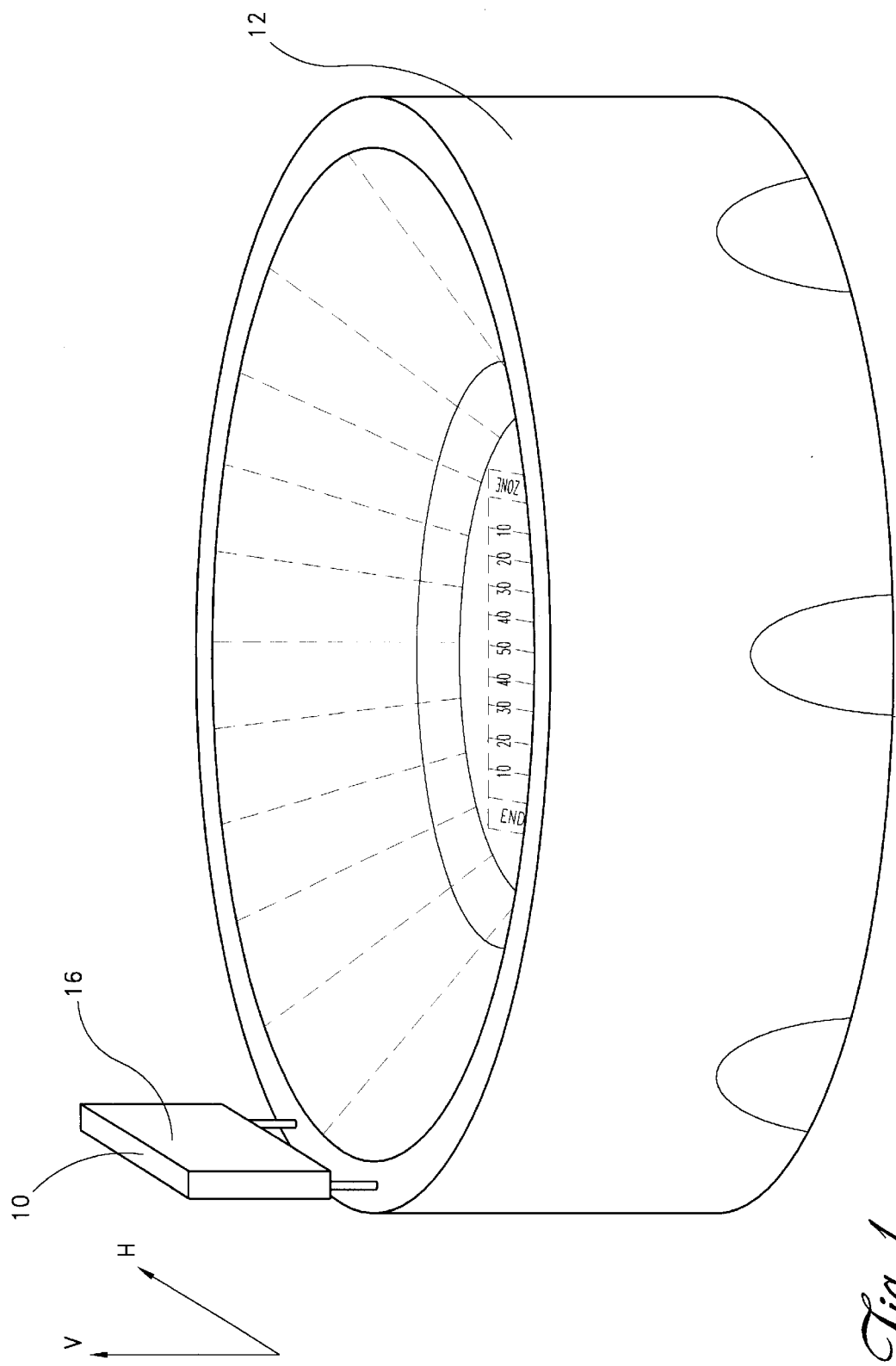
FIG. 1 shows a perspective view of a large fall-color LED display in a stadium having sides oriented in horizontal (H) and vertical (V) directions.
Figure 2:
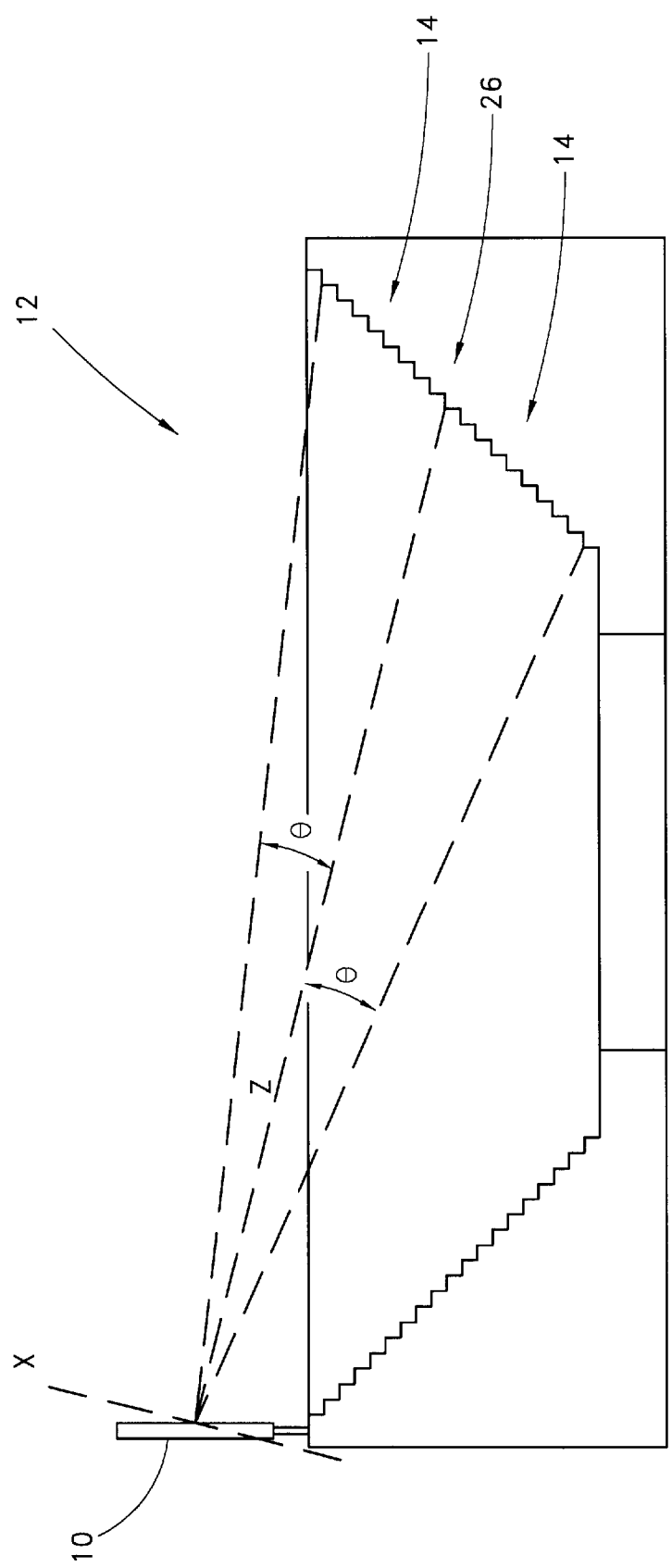
FIG. 2 is a cross-sectional view of the stadium shown in FIG. 1 depicting the LED display with respect to an axis, x, that is perpendicular to a z-axis.
Figure 3:
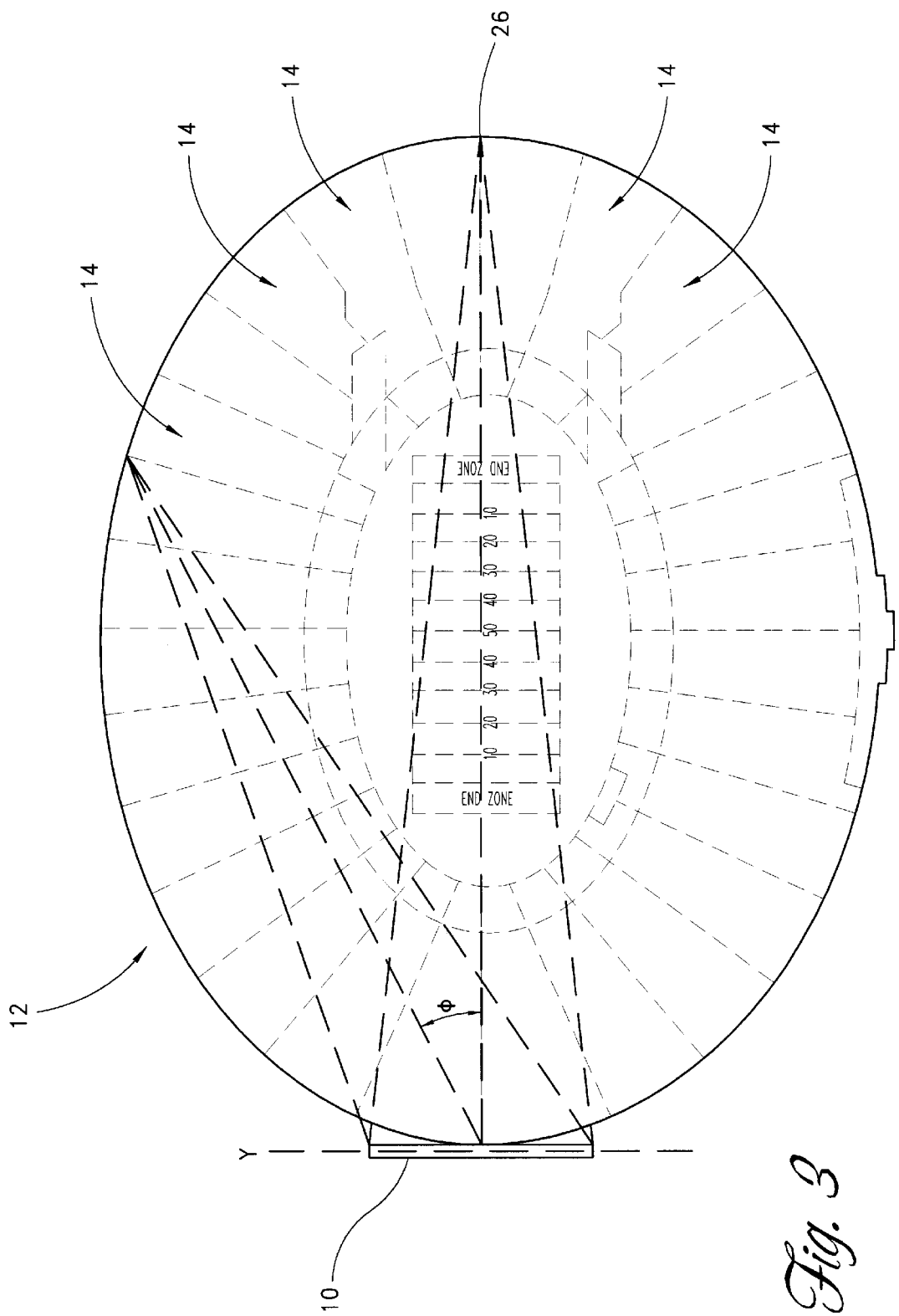
FIG. 3 is a top view of the stadium shown in FIGS. 1 and 2, illustrating the LED display aligned along an axis, y.
Figure 4:
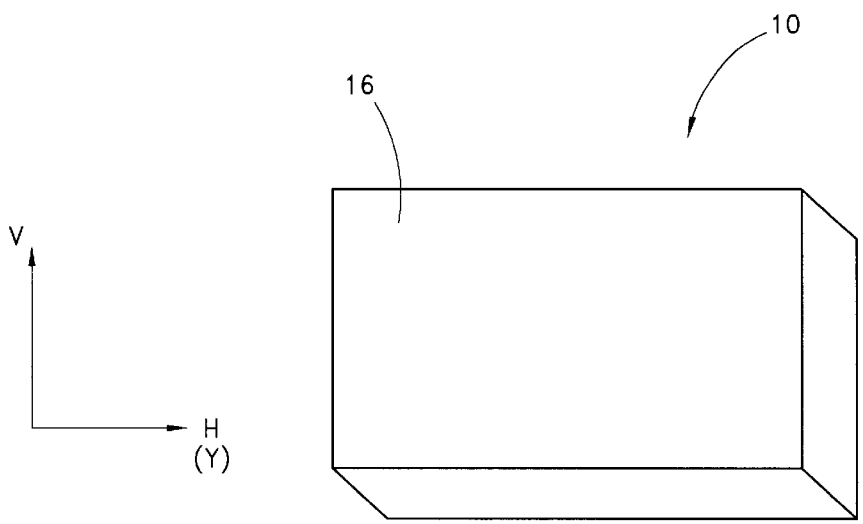
FIG. 4 shows a perspective view of the LED display as seen by a viewer in the stadium seated at a location in front of and below the screen.
Figure 5:
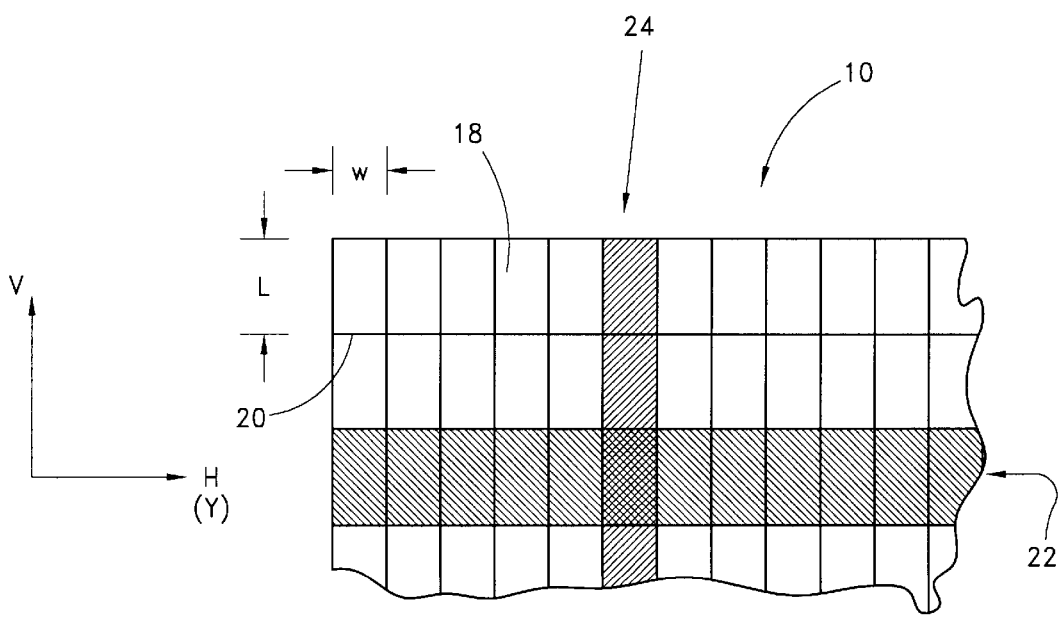
FIG. 5 is a close-up of part of the LED display of FIG. 4, as seen from the front, the display having individual pixels arranged in rows and columns parallel to the horizontal (H) and vertical (V) directions.
Figure 7:
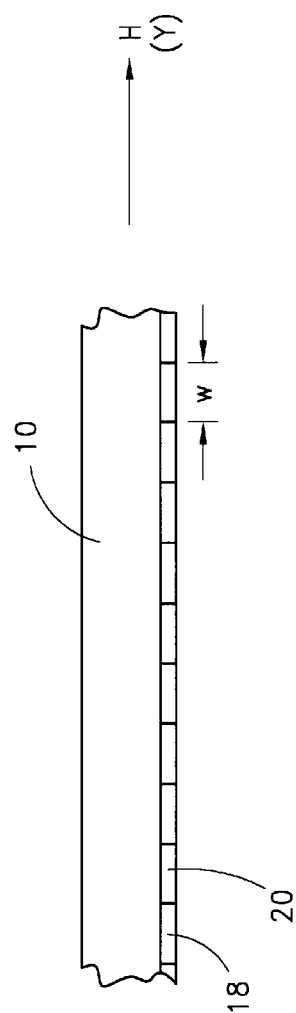
FIG. 7 is a top view of part of the LED display showing the pixels arranged in a row along the y-axis.

As shown in FIGS. 1–3, a large-scale color light-emitting diode (LED) display 10 can be located in a stadium 12 for viewing from a specific section of seating 14. Only one side 16 of the display 10, the front, is visible to the audience. As shown in FIGS. 4–7, this front side 16 of the display 10 comprises a rectangular array of pixels 18 each having a face 20 of length, L, and width, W. The pixels 18 are arranged in rows 22 and columns 24 parallel to vertical (upward) and horizontal (sideways) directions in the stadium. Axes marked V and H in FIG. 1 designate these vertical and horizontal directions.

Figure 6:
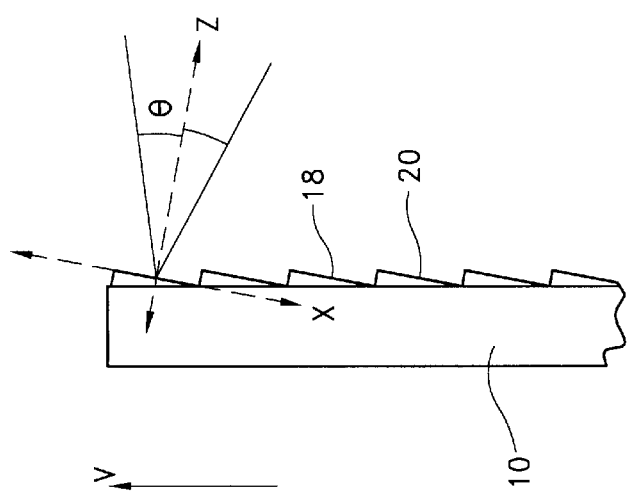
FIG. 6 is a side view of part of the LED display showing a column of pixels, each pixel tilted to be parallel with the x-axis and perpendicular to an axis, z.

Another frame of reference more closely associated with the orientation of the pixels 18 in the array 10 is provided by an x, y, z, coordinate system shown in FIGS. 2–7. In this coordinate system, the row 22 of pixels 18 coincides with the y-axis, which is aligned with the horizontal direction, H. In contrast, the x-axis, which is parallel to the pixel length, is not aligned with the vertical direction, V. As depicted in FIG. 6, the individual pixels 18 are preferably tilted toward the section 14 of seating where the viewers are located, and thus the x-axis deviates an appropriate angle from the vertical V direction. Most preferably, the pixels 18 are tilted at an angle of between about 5 and 20 degrees with respect to the vertical, V. The remaining part of the x, y, z coordinate system, the z-axis, tends towards the viewers, and is perpendicular to the x and y axes. It is therefore normal to the face 20 of the pixel 18.

Preferably, the pixels 18 are oriented such that the z-axis extends from the display 10 to a central point 26 within seating-section 14. (See FIGS. 2 and 3.) Also, preferably the LED display 10 is configured to direct most of its optical energy into a limited range of angles, θ, in the x-z plane, a range that corresponds to the region in the x-z plane where the audience is seated. This angle, θ, as defined in the x-z plane is shown in FIG. 2. (Unless otherwise indicated, all angles are defined with respect to a perpendicular to the face 20 of the pixel 18, which corresponds to the z-axis.) This angle, θ, may, for example, be equal to about 30° but may otherwise range from 5° to 45°, depending on the specific display application and location. In contrast, the audience views the display 10 from a wider range of angles in the y-z plane, as shown in FIG. 3. Accordingly, the LED display 10 is preferably tailored so as to emit most of its energy within a region in the y-z plane subtended by the angle, Φ defined in the y-z plane. This angle, Φ, may extend, for example, through 60° or even to angles as large as 80°, at which display foreshortening would be nearly prohibitive for image intelligibility.

Preferably, the pixels 18 in the display 10 comprise or approximate Lambertian emitters and are governed by Lambert's Cosine Law, which holds that the intensity or flux per unit solid angle emanating in a given direction with respect to a normal to that emitter is proportional to the cosine of the angle between that direction and the normal. The display 10 will then have constant brightness for all viewing angles. Accordingly, the intensity output from the pixels 18, as directed to the audience, preferably varies with angle θ and Φ, defined with respect to the z-axis, at a rate substantially proportional to $\cos(\theta)$ and $\cos(\Phi)$, respectively. Such a fall-off is defined, herein, as a 'cosine fall-off'.

Figure 8:
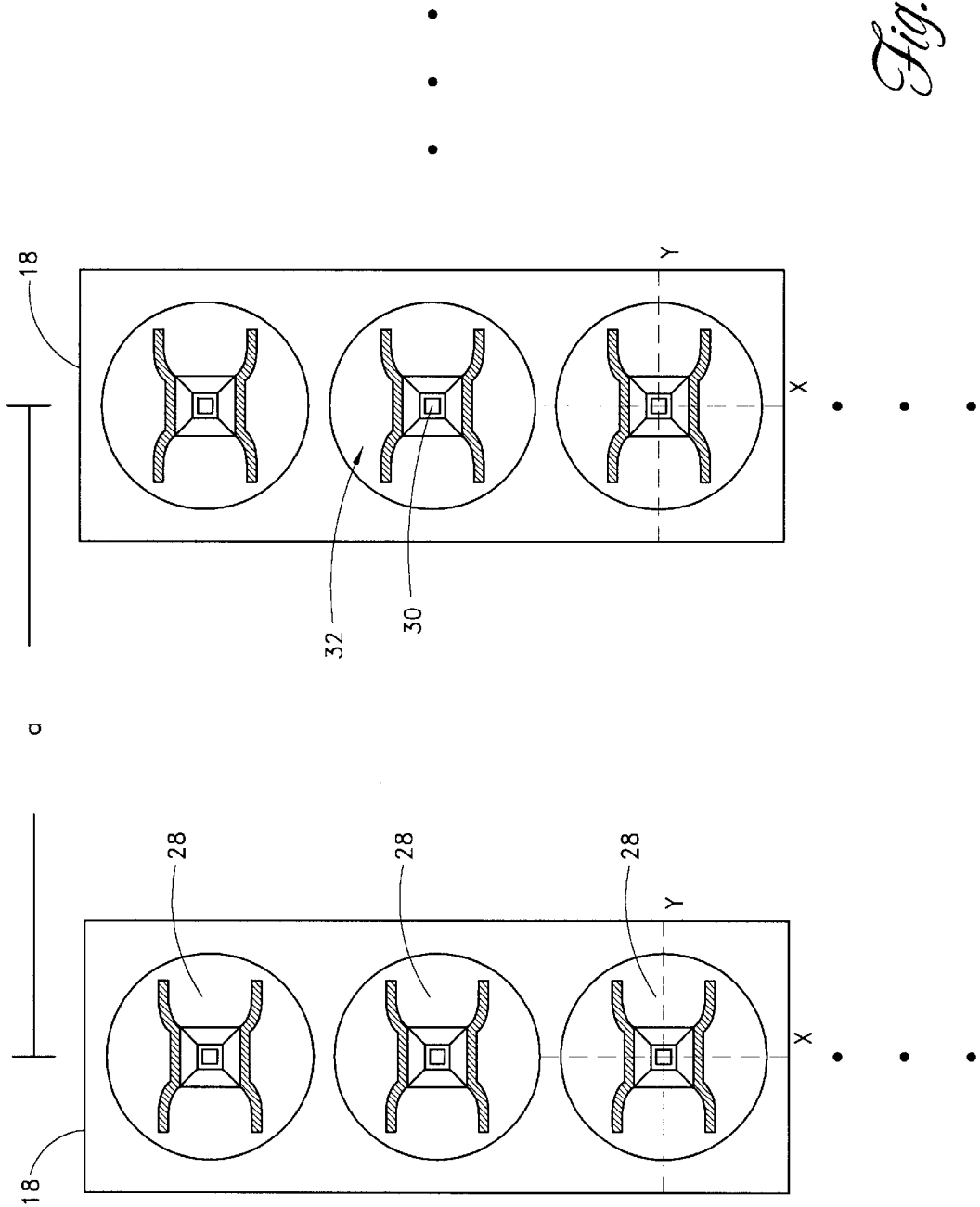
FIG. 8 depicts a top-view of a plurality of pixels in the LED display, specifically showing three color-elements in each pixel, each color-element including an LED and beam-shaping optics.
Figure 9:
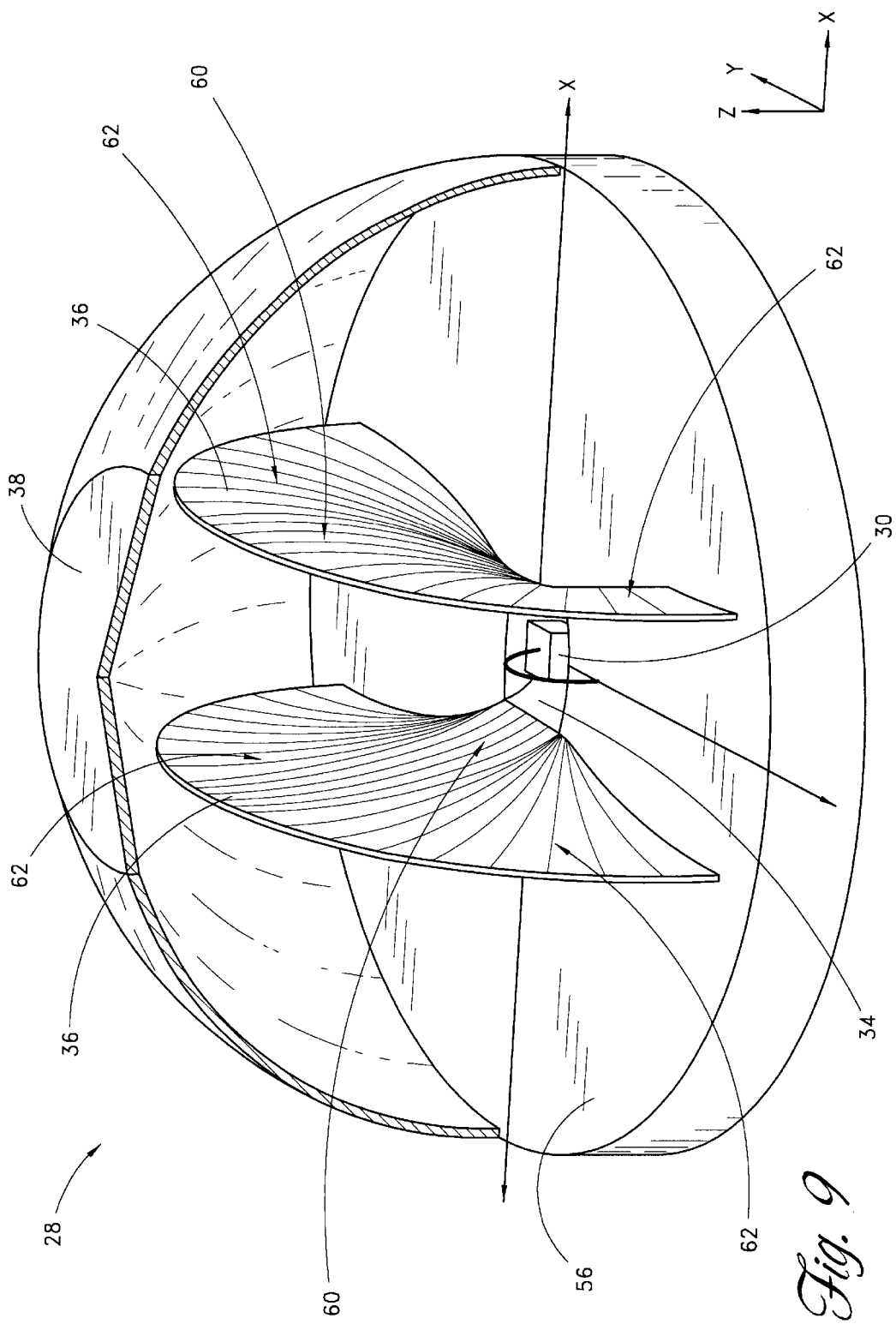
FIG. 9 is a perspective view of the LED and beam-shaping optics included in an individual color element centered about the x, y, and z axes.
Figure 10:
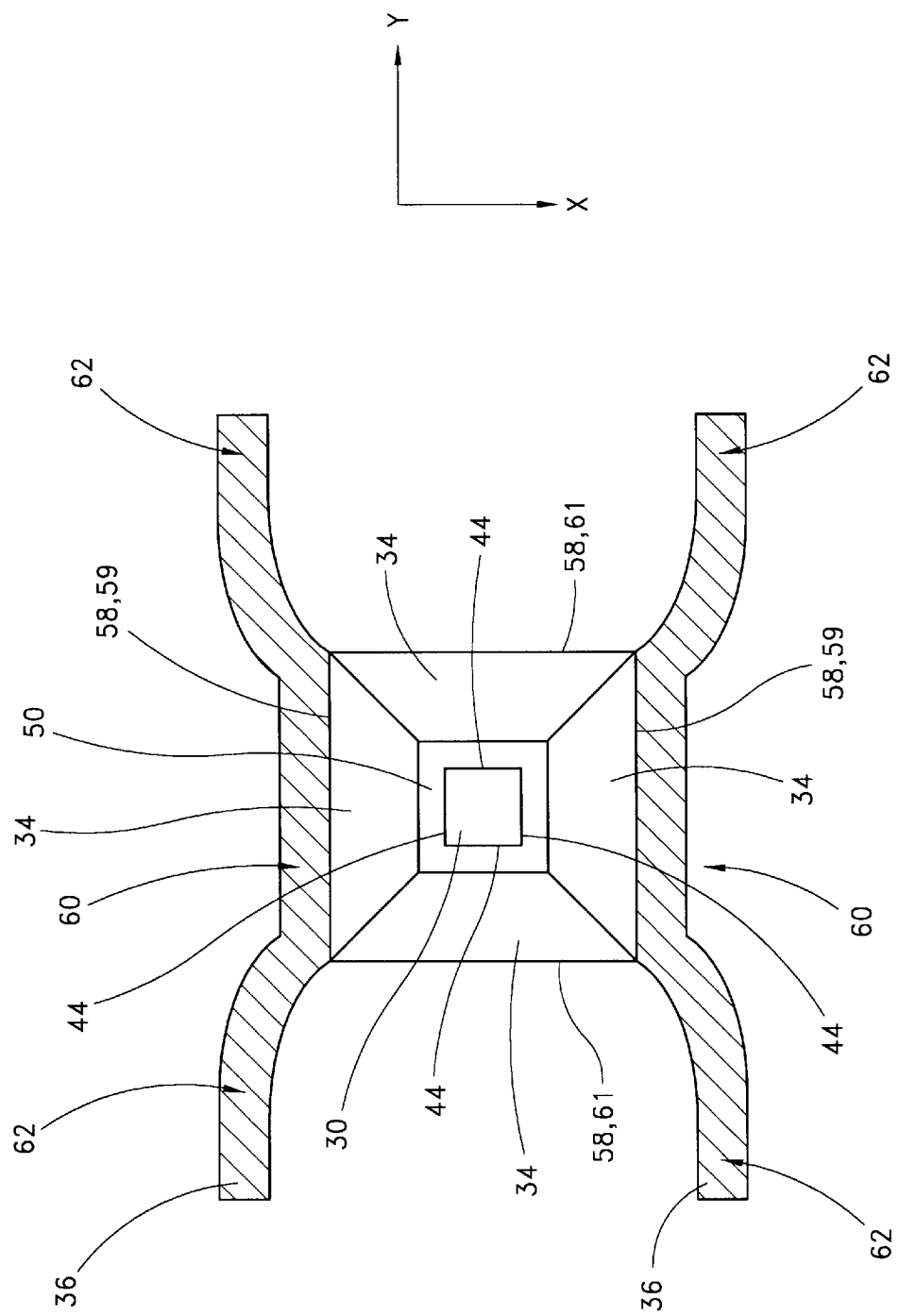
FIG. 10 depicts a top-view of the LED, Lambertianizing cup, and curved narrow-field-of-view reflectors within the color element of FIG. 9.

To provide a fall range of hues, each pixel 18 includes three light sources 28, which are depicted in FIGS. 8–10. The light sources 28 are arranged in a column, one above the other within a single pixel 18, the three light sources forming a line parallel to the x-axis. Each light source 28 within the pixel 18 comprises a solid-state emitter 30, such as a light-emitting diode (LED). These LEDs 30, may comprise, for example, red, blue, and green LEDs or in an a costlier alternative, red, yellow, green, and blue LEDs.

Preferably, these light sources 28 output an intensity that decreases or falls off with angle θ and Φ at substantially the same rate. Most preferably, this fall-off is substantially proportional to cos θ and cos Φ for the section of seating 14 facing the display 10. Having a substantially identical fall-off minimizes color-rendering errors that would otherwise result if one color of the triad were relatively brighter than another. Such a problem may be encountered when employing solid-state emitters 30 as light sources 28 since differently colored LEDs may exhibit different fall-offs, according to their differing construction. Intensity output from a red LED, for example, falls off significantly slower than does that of a blue or green LED. Accordingly, the light source 28 must be designed so as to compensate for the various fall-off characteristics of the LEDs 30 in order to provide the same, nearly Lambertian, fall-off.

To tailor their emission appropriately, each of the LEDs 30 is combined with a respective miniature intensity-enhancing optical system or beam-shaping optics 32. The beam-shaping optics 32 comprises a set of four wide-field-of-view Lambertian reflectors 34, a pair of narrow-field-of-view Lambertian reflectors 36, and a beam-shaping lens 38 formed from an optically transmitting medium. A perspective view of the light source 28 including the LED 30 and the beam-shaping optics 32 is shown in FIG. 9; a top view that does not show the beam-shaping lens 38 is provided in FIG. 10. In accordance with the present invention, beam shaping optics 32 are provided with the LEDs 30 to create Lambertian emitters. When an LED 30 does not have a Lambertian pattern by itself, the associated optics 32 will cause such a pattern to be produced, and hence said optics are herein termed Lambertianizing.

The size of each pixel 18 is small relative to the entire display 10. Although the display 10 may range from 10 to 60 feet tall and from 15 to 90 feet wide, it contains from between about 100,000 to 2 million pixels. These pixels 18 are separated from each other in the y direction by a distance a, see FIG. 8, which may range from about 0.25 to 1.5 inches. The size of these the reflectors 34, 36 in the pixel 18 is governed in large part by the size of the LEDs 30, which range between about 0.01 to 0.04 inches in length and width and from 0.003 to 0.01 inches of height.

The reflectors 34, 36 necessarily comprise reflective material such as a reflective metal like silver or aluminum, and may be formed by stamping or by molding. Other known and yet to be discovered techniques for forming miniature reflective surfaces can be suitably employed as well.

Figure 11:
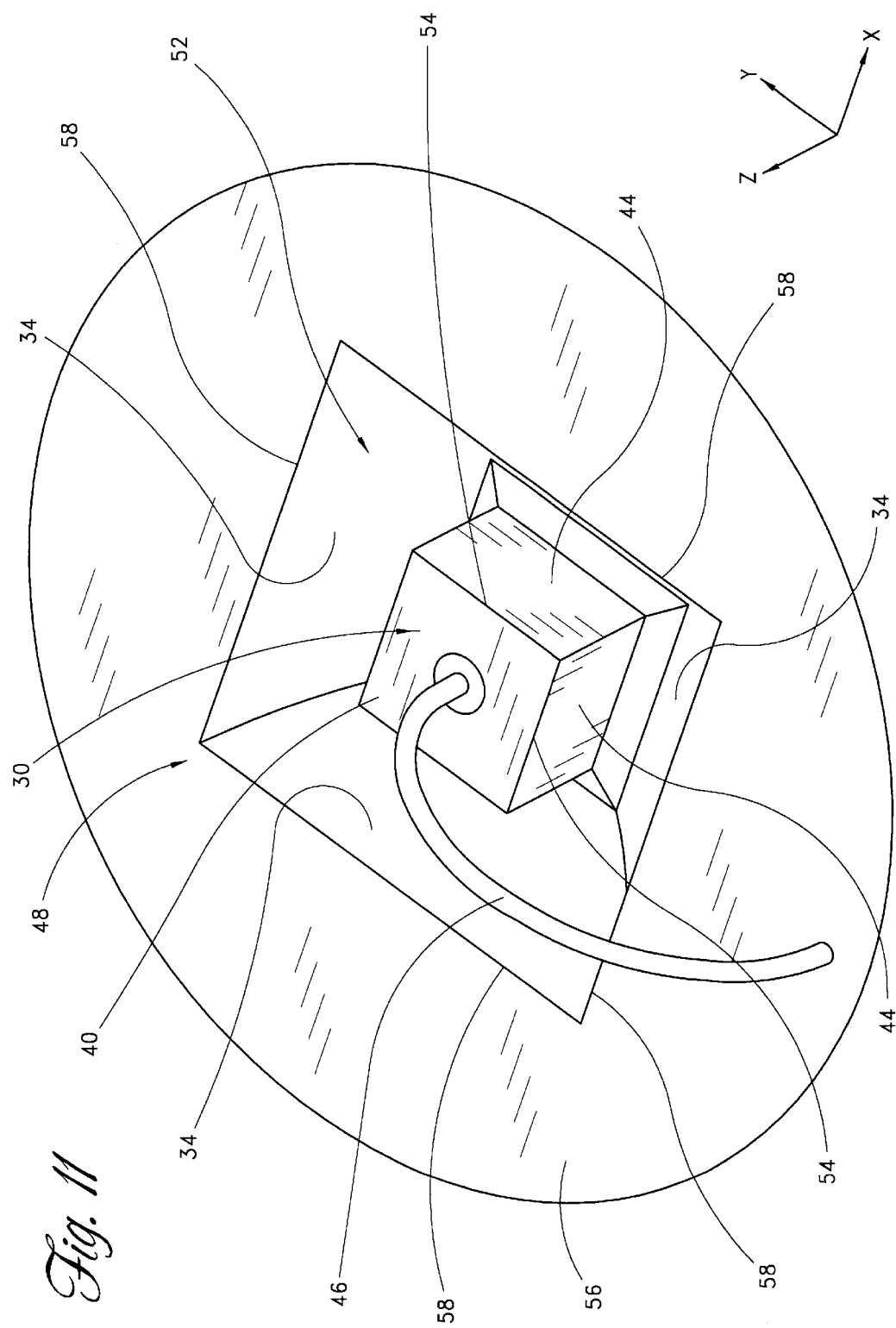
FIG. 11 shows a perspective view of the LED within the Lambertianizing cup comprising four curved, cylindrical, reflectors.

The LEDs 30 in each of the light sources 28 comprise an LED die having six facets, a front 40, a rear 42, (see FIG. 12) and four sides 44 (two of which are visible in FIG. 11). An electrical leadwire 46 extends from the front 40 of the LED die 30 and provides electrical connection thereto.

Figure 12:
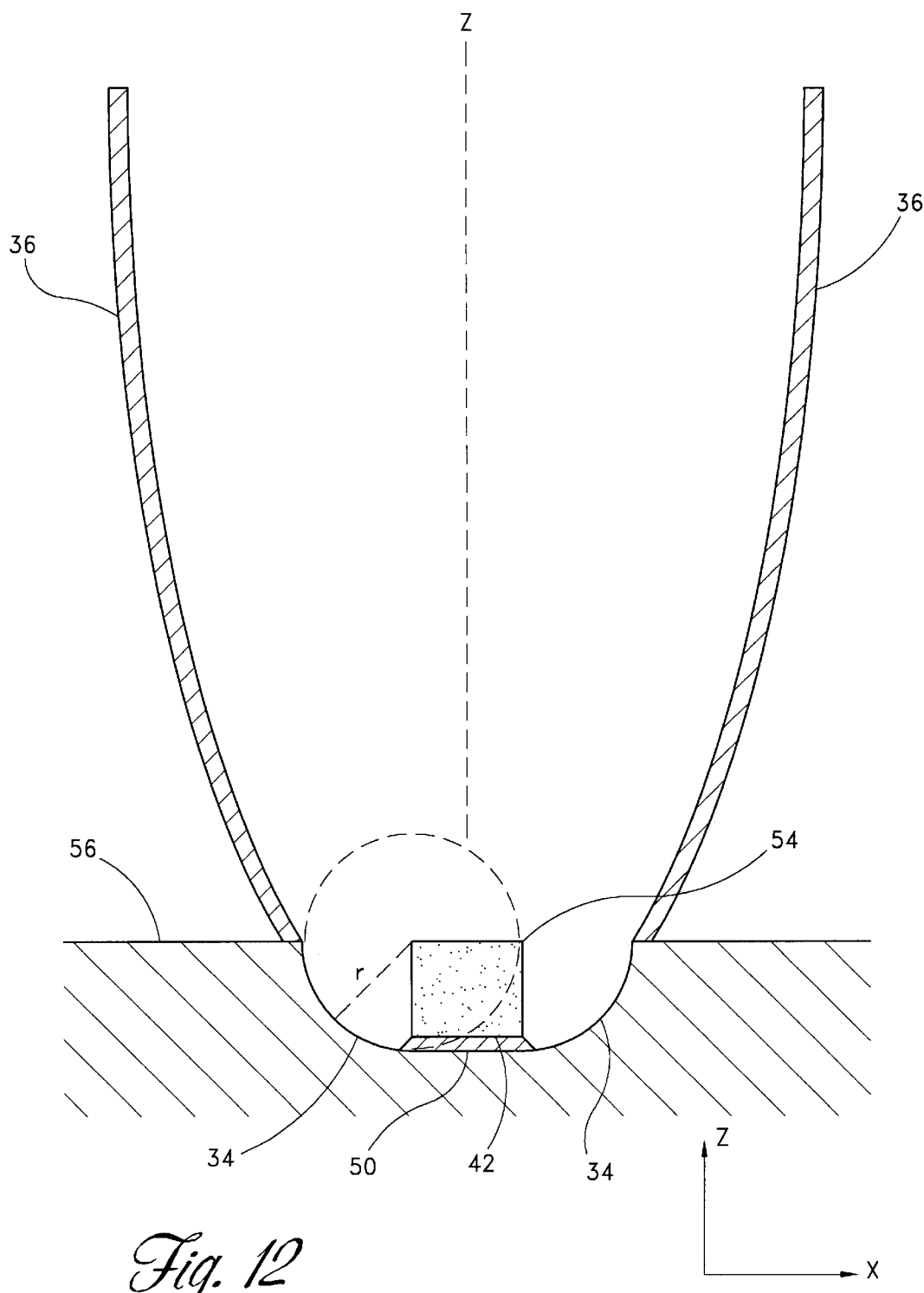
FIG. 12 is a cross-sectional view in the x-z plane of the LED and the Lambertianizing cup with a dotted circle superimposed thereupon that defines the curvature of the cylindrical reflectors in the Lambertianizing cup.

As shown in FIGS. 11 and 12, the LED 30 is contained within a Lambertianizing cup 48 formed from the four wide field-of-view Lambertianizing reflectors 34. The Lambertianizing cup 48 additionally includes a bottom 50 in which the LED die 30 sits. Positioned within the cup 48, the LED die 30 is surrounded by the four wide field-of-view Lambertian reflectors 34 that curve inward to join with the bottom 50. Each of the four reflectors 34 also are joined to two of the reflectors adjacent thereto, forming a partial enclosure that cups the LED 30. The LED 30 is situated within the cup 48 such that each of its four sides 44 face one of the four wide-field-of-view Lambertian reflectors 34. With the rear 42 mounted on the bottom 50 of the cup 48, the front 40 of the LED 30 faces a square or rectangular opening 52 in the cup, hereinafter referred to as the aperture. This square or rectangular aperture 52 is bounded and defined by the four reflectors 34. Preferably, the aperture of the Lambertianizing cup 48 is in a plane containing the front surface 40 of the LED.

As is typical, the LED 30 illustrated in FIG. 10 possesses four-fold symmetry, wherein its four sides 44 are substantially identical. As shown, two of the sides 44 are parallel to the x-z plane and two of the sides are parallel to the y-z plane. In this case, so too is the Lambertianizing cup 48 four-fold symmetrical. Each of the four wide field-of-view Lambertian reflectors 34 has substantially identical shape and size. Similarly, cross-sections of the LED 30 and Lambertianizing cup 48 along either the x-z or y-z planes are substantially indistinguishable. The Lambertianizing cup 48 may therefore in the alternative be described as comprising two orthogonally opposed pairs of identical reflectors. These two pairs are separated along the orthogonal x- and y-axes. The cross-section of one pair that is separated along the x-axis is depicted in FIG. 12. This cross-section is taken along the x-z plane.

The cross-section of one of the wide-field-of-view Lambertian reflectors 34 is an arc. Along the sides 44 of the LED 30, this arc continues down to the base 50 of the Lambertianizing cup 48. Similarly, the wide-field-of-view reflector 34 corresponding to the arc that is depicted in FIG. 12, has a surface that substantially coincides with a locus of points intersecting the arc as it is translated along a line parallel the y-axis. This reflector surface has a length along the y-direction at least as great as the side 44 of the LED 30 opposite to the reflector surface. Preferably, however, this surface extends farther along the y-axis where it meets two of the other wide field-of-view Lambertian reflectors 34. A partial enclosure that cups the LED 30 can be formed with four such similarly shaped surfaces, each of the wide field-of-view reflectors 44 having a substantially cylindrical surface. More particularly, this surface substantially coincides with a locus of points intersecting an arc as it is translated along a line, thereby forming a cylindrical surface. Two of the cylindrical reflectors are lengthwise parallel to the y-axis; the other two parallel to the x-axis. These four cylinders are actually lengthwise parallel to the four upper edges 54 on the LED die 30 where the front surface 40 of the LED and the side 44 of the LED opposite the reflector 34 intersect. These four reflectors 34 can also be defined with respect to these four upper edges 54; in particular, their arcs are preferably formed by circles having as their centers, points on the upper edges of the LED 30. The radius of these circles may correspond to a distance that separates the front 40 of the LED 30 from the bottom 50 of the Lambertianizing cup 48.

The Lambertianizing cup 48 thus preferably comprises four cylindrically shaped reflectors 34 having a radius of curvature, r, which corresponds to the distance of the reflective surface to the nearest upper edge 54 of the LED 30. These cylindrical reflectors 34 are oriented so as to approach the LED 30 or a base below and in contact with the LED comprising of, e.g., solder. Accordingly, the radius of curvature, r, defining the cylindrical shaped reflectors 34 is preferably sufficiently large that the cylindrical reflectors extend to or below a lower edge on the rear 42 of the LED 30. A substantial portion of the light from the LED 30 can therefore be collected and directed through the aperture 52 of the Lambertianizing cup 48. The size of the Lambertianizing cup 48 is characterized by a depth somewhat greater than the height of the LED die, and an overall width greater than the sum of the die width and twice its height.

A noteworthy feature of conventional LEDs is that not all the light emitted by the LED 30 is directed out the front face 40. In addition to emitting from the front 40, LEDs radiate from all four side-walls 44. This sideways directed light may be lost by being radiated in a direction where it will not be used or where it will be subsequently absorbed, e.g., by another LED. The Lambertianizing cup 48 collects light emitted by the four sides 44 and redirects this side emission through the aperture 52 of the cup as if emitted from the front 40 of the LED. Light from the sides 44 is reflected off the wide-field-of-view reflectors 34 and through the square or rectangular aperture 52 of the Lambertianizing cup 48. Emission that would otherwise be wasted by being misdirected and possibly being absorbed can be saved, resulting in substantially improved efficiency of the light source 28 and pixel 18. The design of this Lambertianizing cup 48 is also optimized for maximum throughput. This non-imaging optical element 48 described herein may, for example, improves the efficiency of the LED pixel 18 by a factor of two or more by efficiently channeling this light output from the sides 44 of the LED 30 forward through the aperture 52 of the element.

In addition, the wide field-of-view Lambertianizing reflectors 34 are shaped to distribute the light from the Lambertianizing cup 48 in conformance with Lambert's Cosine Law. Accordingly, the intensity of light emitted from the Lambertianizing cup 48 falls off with angle θ and Φ at a rate substantially proportional to cos θ and cos Φ, respectively. The reflectors 34 effectively provide a substantially Lambertian or cosine fall-off so that the rectangular aperture 52 of the Lambertianizing cup 48 approximates a planar Lambertian surface, which is needed for constant display brightness.

This Lambertian fall-off with angle θ is limited to a narrow range of angles, (e.g., about ±30°) by the pair of narrow field-of-view reflectors 36, which are positioned above the Lambertianizing cup 48. In the embodiment depicted in FIG. 9, these narrow field-of-view reflectors 36 are formed on a plane 56 containing the square aperture 52 of the Lambertianizing cup 48. This plane 56 also contains four distal ends 58 (see FIGS. 10 and 11) of the wide-field-of-view reflectors 34 that make-up the Lambertianizing cup 48, four other proximal ends converging with the bottom 50 of the cup. The four distal ends 58 correspond to the four sides of the square aperture 52 of the Lambertianizing cup 48; two sides 59 of the aperture being parallel to the x-axis and two sides 61 being parallel to the y-axis. The pair of narrow-field-of-view reflectors 36 flank two opposite sides the square aperture, namely the two sides parallel to the y-axis. These narrow field-of-view reflectors 36 are spaced apart by a distance, S, (see FIG. 13) sufficient to fit the square aperture 52 therebetween.

Figure 13:
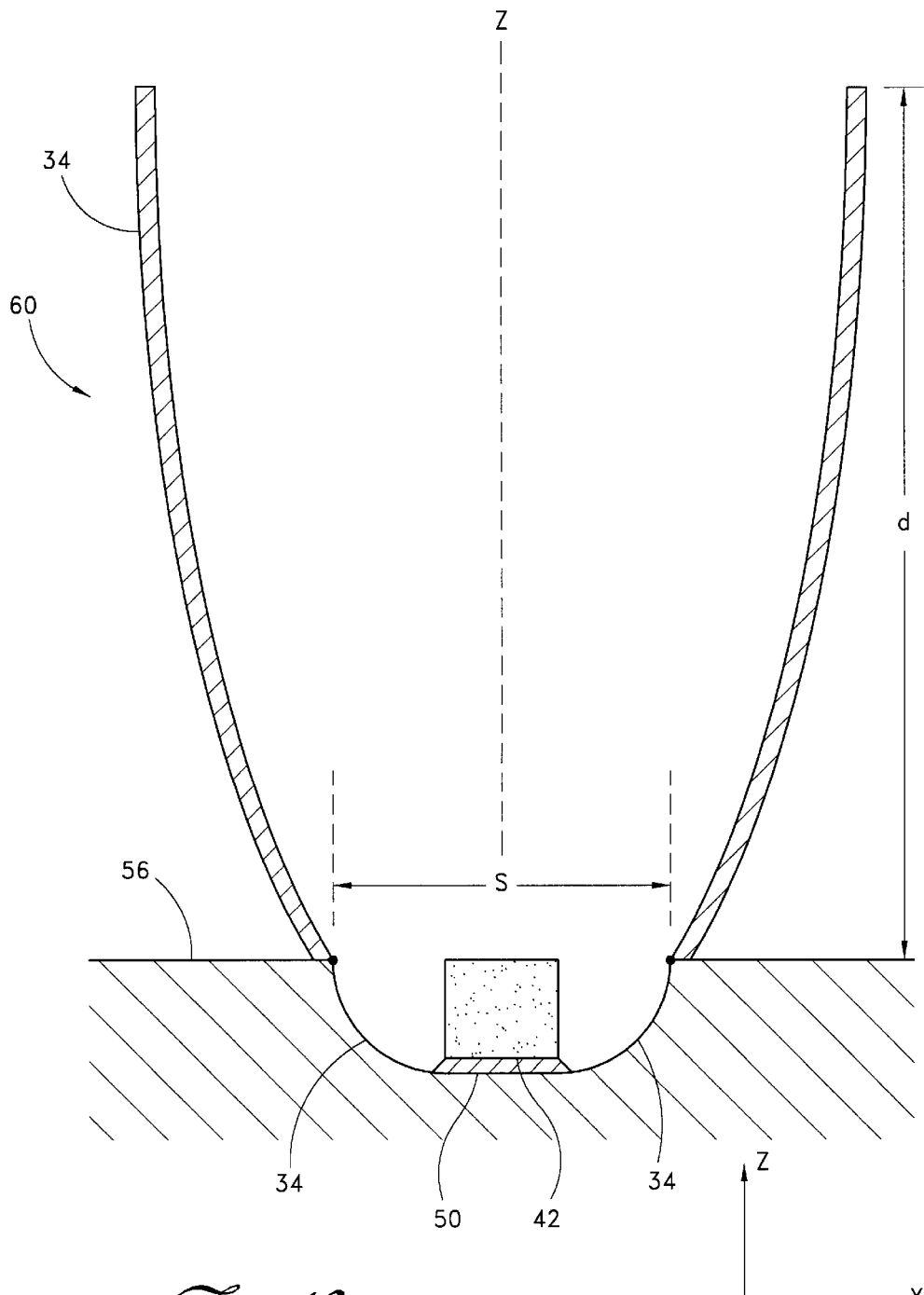
FIG. 13 depicts a cross-sectional view of the LED, the Lambertianizing cup, and curved narrow field-of-view reflectors along the x-z plane that is illustrated in FIG. 12, with the spacing between the narrow-field-of-view reflectors indicated as S.

As shown in FIG. 9, each of the reflectors 36 comprises a middle section 60 and two end sections 62 on opposite ends of the middle section. A cross-section of the narrow field-of-view reflectors 36 that depicts the middle section 60 is shown in FIG. 13. As illustrated in the drawings, the middle sections 60 extend from the two distal ends 58 of the Lambertianizing cup 48 that are parallel to the y-axis. Accordingly, the middle sections 60 are adjoined to and continue along the two sides of the square aperture 52 parallel to the y-axis. Each middle section 60 comprises a surface in the form of a parabolic cylinder that is situated along one these two sides of the aperture 52; the other side serves as a line focus for this parabolic cylinder. This parabolic cylinder can be visualized as a locus of points intersecting a parabola in the x-z plane (see FIG. 14) as it is translated along the respective side of the aperture 52 on a line parallel to the y-axis, such as the line focus. This middle section 60 has a length along the y-direction equal to the sides of the aperture 52 parallel to the y-axis. This middle section 60 has a height, d, in the z direction of between about 0.1 and 0.4 inches, depending on the size of the LED 30 and the Lambertianizing cup 48.

The middle sections 60 together form a linear compound parabolic concentrator (CPC) trough situated above with Lambertianizing cup 48. This CPC trough extends through the full length of the aperture 52 of the cup 48, contacting the two distal ends or upper edges 58 of the cylindrical reflectors 34 of the Lambertianizing cup that are parallel to the y-axis.

Compound parabolic concentrator troughs are well-known non-imaging optical elements. Being non-imaging optical elements, they are designed to maximize optical throughput; image formation is not a primary goal. The CPC design and the defining parabolic shape is discussed in detail by W. T. Welford and R. Winston in "The Optics of Non-imaging Concentrators," Academic Press, New York, 1978, pp. 171–173. See also U.S. Pat. No. 5,924,788 issued to Parkyn, Jr., U.S. Pat. No. 4,130,107 issued to Rabl et al, U.S. Pat. No. 4,230,095 issued to Winston, U.S. Pat. No. 4,359, 265 issued to Winston, U.S. Pat. No. 4,387,961 issued to Winston, U.S. Pat. No. 4,237,332 issued to Winston, U.S. Pat. No. 4,240,692 issued to Winston, and U.S. Pat. No. 4,114,592 issued to Winston, which are incorporated herein by reference.

Figure 14:
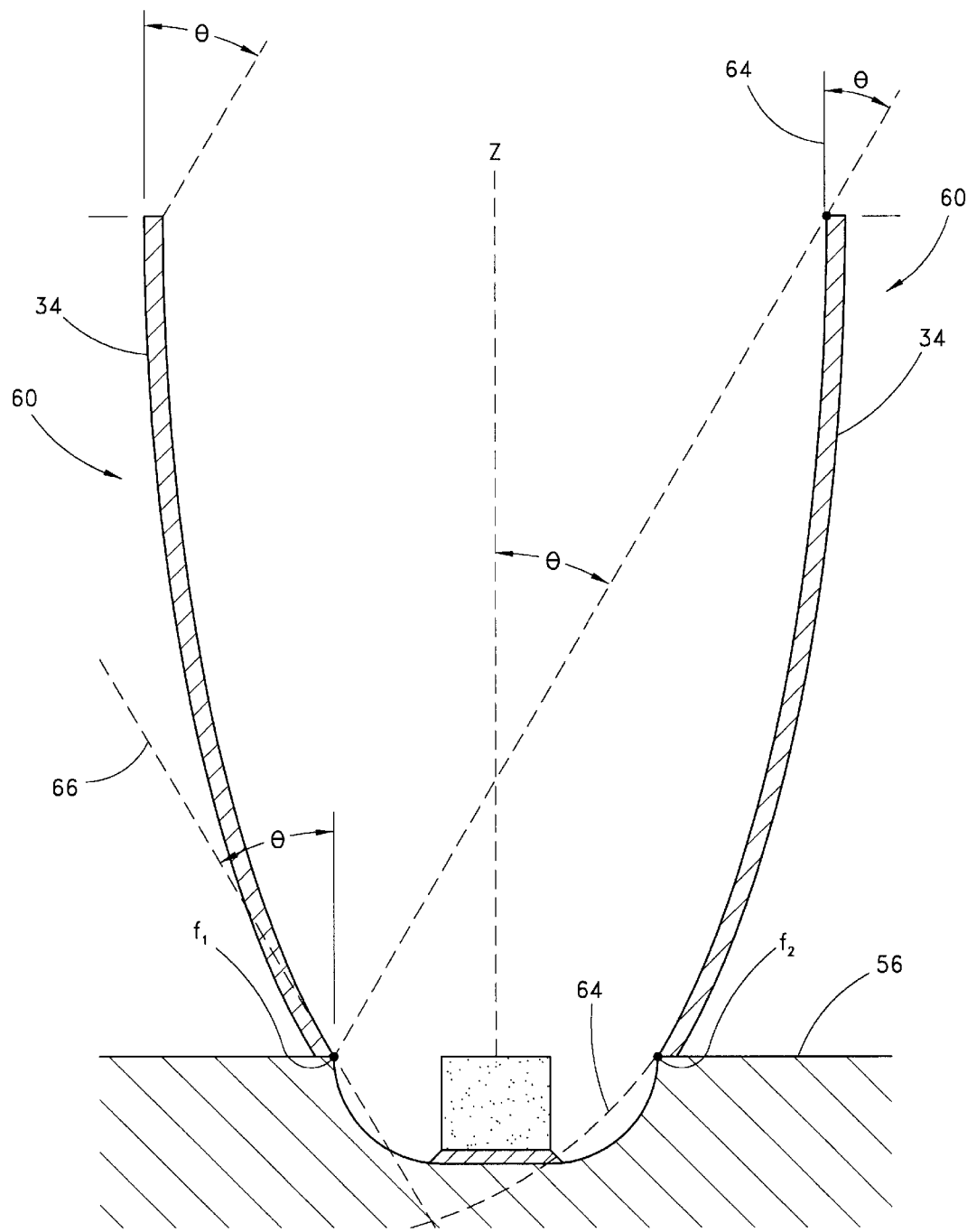
FIG. 14 depicts the cross-sectional view of FIG. 13 and a parabola for defining the curvature of the narrow-field-of-view reflectors.

In particular, a CPC is formed from a pair of parabolically shaped curves located on either side of an axis, here, the z-axis; one such parabola 64 is depicted in FIG. 14. These curves comprise segments from two tilted parabolas. The CPC has a base defined by the spacing S between the two parabolically shaped segments. Each segment corresponds to one of the reflective surfaces of the CPC. One such reflective surface is located right of the z-axis and is defined by the parabola 64 having a focus $f_1$ on the opposite side of the z-axis, i.e., left of the z-axis. To get a CPC with a collection angle θ of 30°, this parabola 64 is rotated 30° counterclockwise. FIG. 14 shows the parabola 64 with axis 66 passing through the focus $f_1$ tilted 30°. The tilted parabola 64 continues upward until its slope is vertical. A portion of this parabola 64 defines the first parabolically shaped curve that is used to form one of the reflecting surfaces. Another reflective surface of the CPC trough has a curvature characterized by an identical parabola but with focus at $f_2$ on the other side z-axis, i.e., right of the z-axis, and that is tilted 30° clockwise. A second parabolically shaped curve can be defined from this other parabola and used to generate the other reflective surface. The two parabolically shaped curves are mirror images about the z-axis. So too are the CPC trough and the reflective surfaces symmetrical about the z-axis. The CPC trough is formed by translating the two parabolically shaped curves in a direction perpendicular to the x-z plane, i.e., in the y-direction.

The pair of narrow field-of-view reflectors 36 does not, however, comprise solely a simple compound parabolic concentration, rather, the reflectors additionally include end sections 62 appended to opposite ends of the respective middle section 60. Referring again to FIGS. 9 and 10, the rectangular aperture 52 of the Lambertianizing cup 48 has four sides 59, 61 formed from the four wide field-of-view reflectors 34. Two sides 61 are parallel to the x-axis and two sides 59 are parallel to the y-axis. The two narrow-field-of-view reflectors 36, at least in the middle sections 60, extend along the two sides 59 that are parallel to the y-axis. Accordingly, each middle section 60 has an end near a side 61 of the rectangular aperture 52 that runs parallel to the x-axis. One end section 62 is attached to each of these ends. Thus, each end section 62 is associated with one of the two sides 61 of the aperture that runs parallel to the x-axis.

Figure 15:
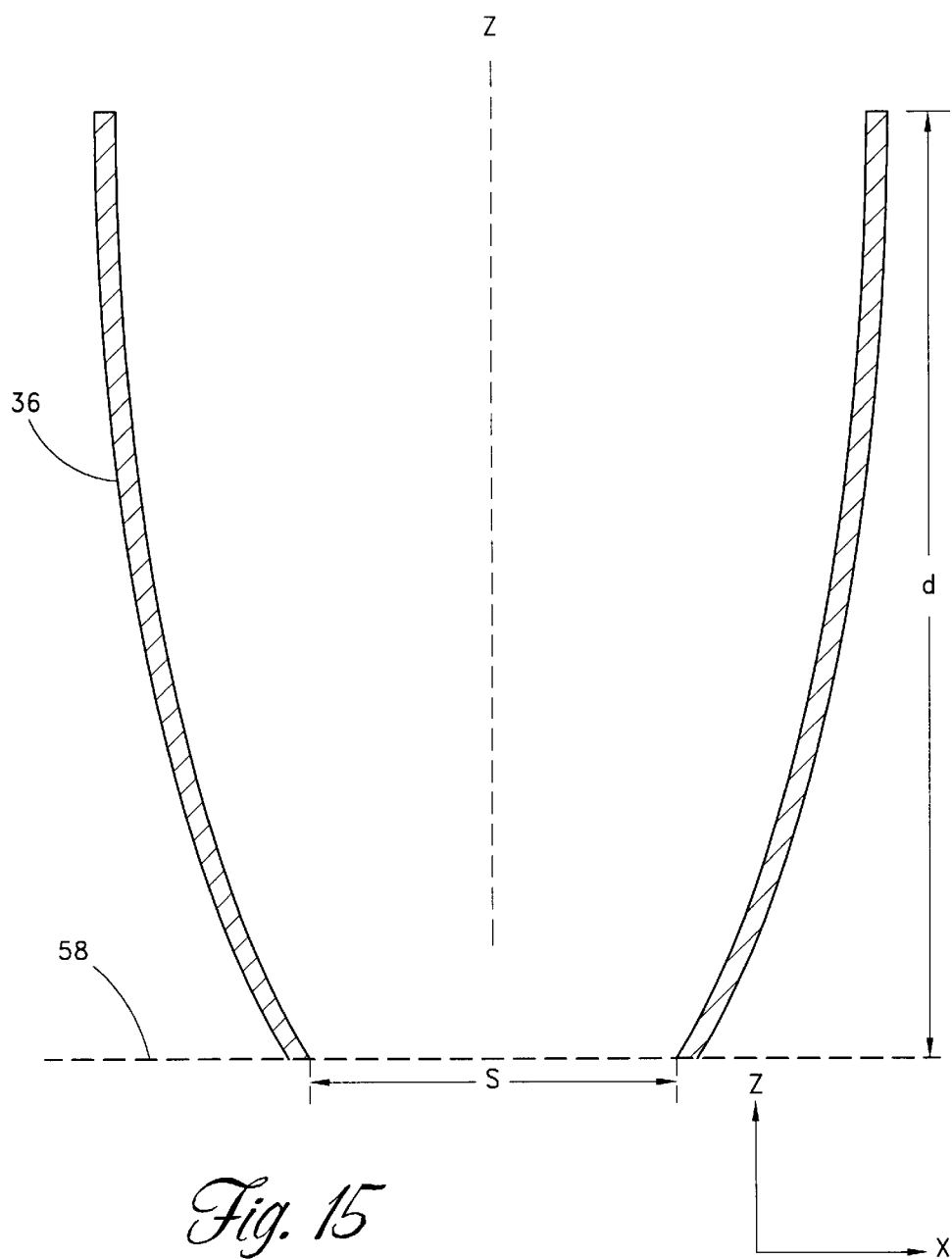
FIG. 15 shows a cross-sectional view of the curved narrow-field-of-view reflectors in a plane parallel to the x-z plane defined in FIG. 9.

FIG. 15 shows a cross-section of the narrow field-of-view reflectors 36 taken along a plane parallel to the x-z plane that passes through one of these two sides 61. At this location, the middle section 60 of the reflector ends and the end section 62 begins. As depicted in FIG. 15, the end section 62 joins the middle section 60 along a parabolic line. This parabolic line coincides with the parabolic shape the CPC reflector formed by the middle section 60. This parabolic line also coincides with the parabolic shape of the end section which comprises a surface formed by rotating the parabola of the middle section about an axis coinciding with the side 61 of the aperture 52; this side being the one parallel to the x-axis and proximal to the end section.

Figure 16:
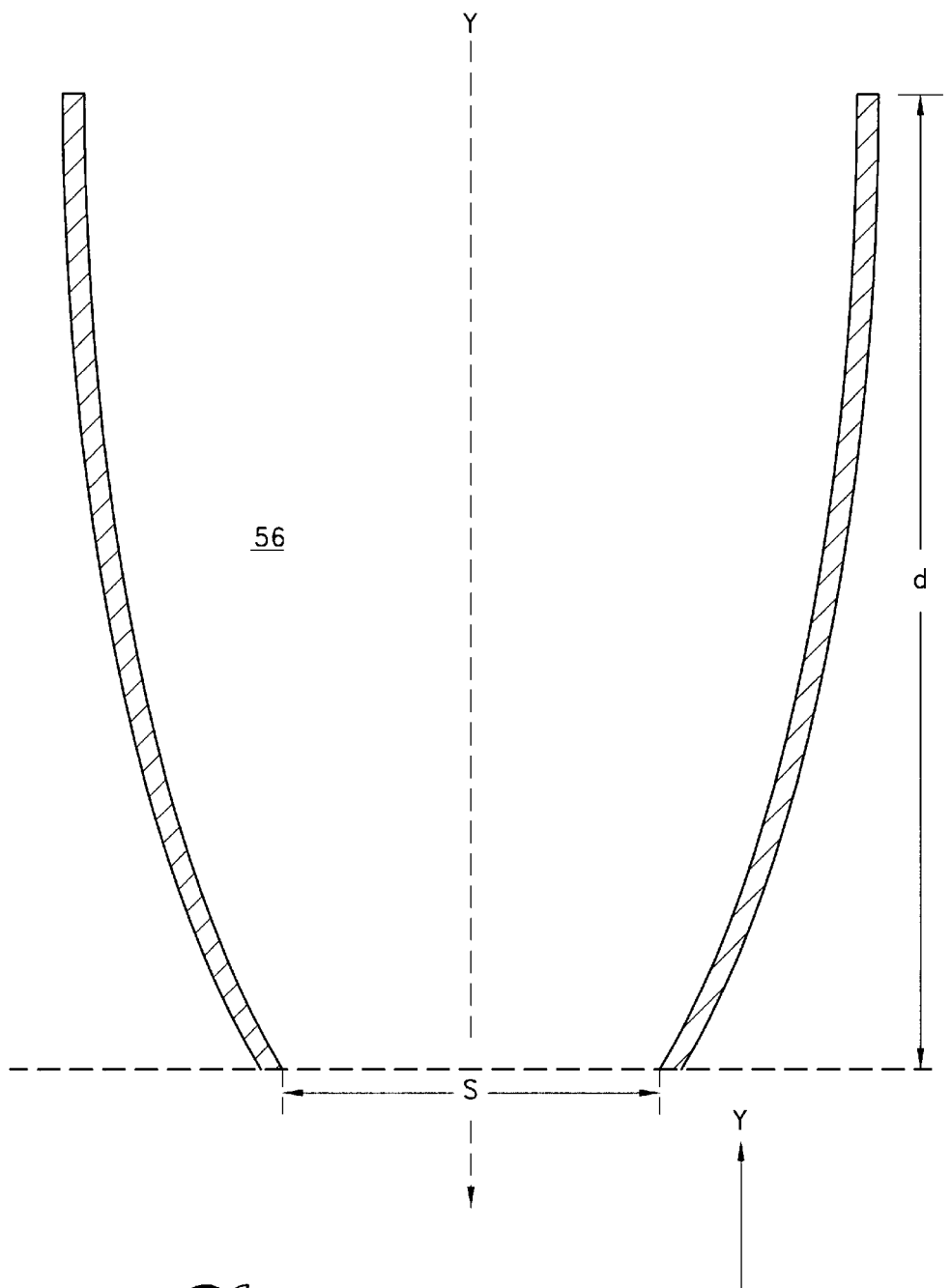
FIG. 16 is a cross-sectional view in the x-y plane of the curved narrow-field-of-view reflectors shown in FIG. 9.
Figure 17:
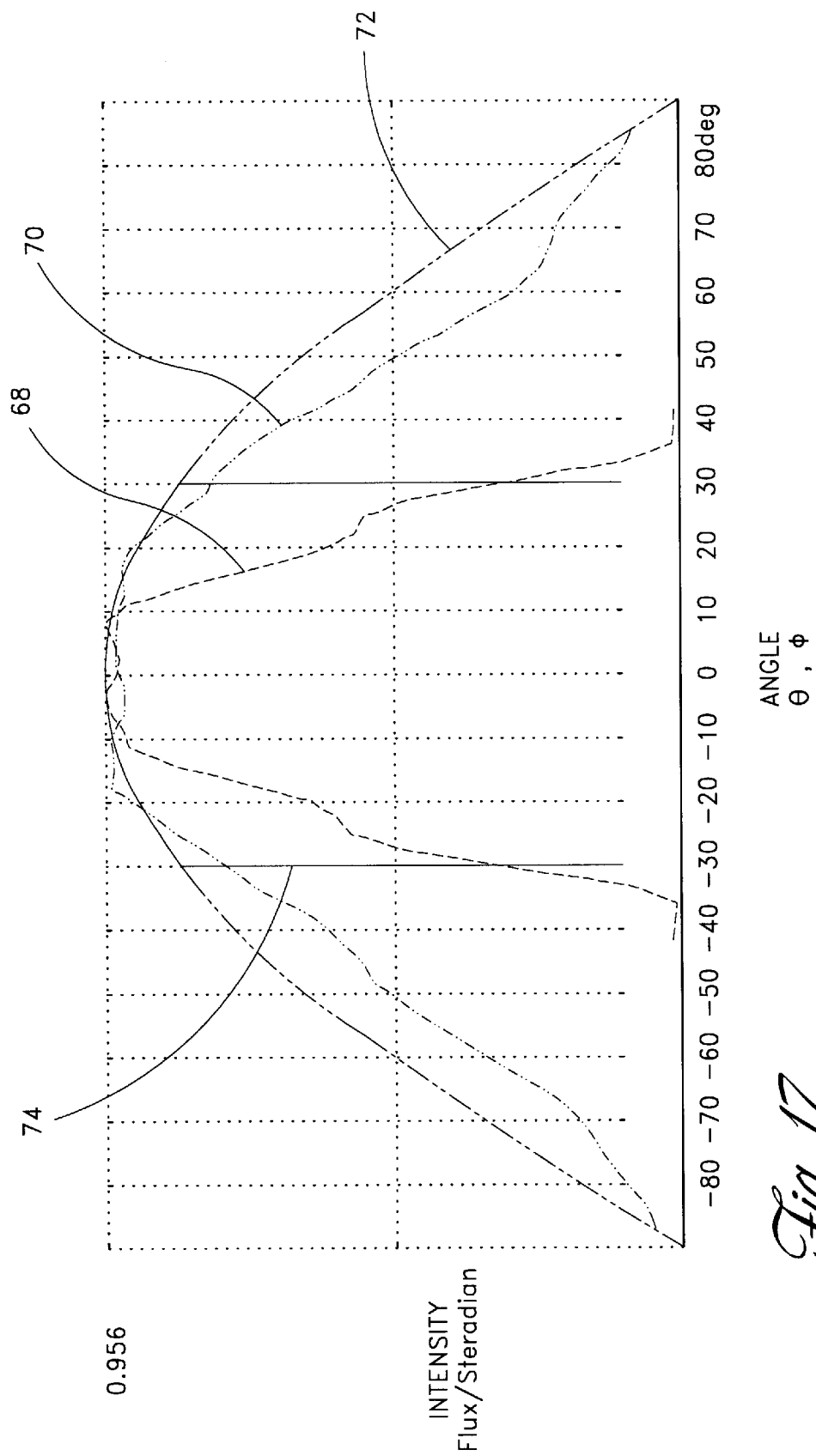
FIG. 17 is a plot on axes of angle, in degrees, and intensity, in flux per steradian, depicting how intensity output from the miniature optical system falls off with angle in directions along the x and y axes as compared with a Lambertian or cosine angle intensity fall-off.

The four end sections 62 thus each comprise surfaces having a shape in the form of a paraboloid, the axis of rotation for the end sections being the two sides 61 of the rectangular aperture 52 parallel to the x-axis. The shape corresponds to that formed by perpendicularly rotating the parabola corresponding to the respective edges of the CPC trough (see FIG. 15) 90° about a line co-linear with the sides 61 running parallel to the x-axis and closest to that edge. As depicted in FIG. 16, this parabola when completely rotated, reside entirely in the plane 56 parallel to the x-y plane that contains the aperture 52. The shape so formed can be characterized as quasi-toroidal. Accordingly, the four end sections 62 comprise quasi-toroidal sections corresponding to rotated parabolas. Note that each of these four rotated parabolas has a point focus located on one of the four corners of the square aperture.

The shape of the two pairs of end sections 62, together with the respective middle section 60 is appropriately selected to collect the light passing through the aperture 52 of the Lambertianizing cup 48 and efficiently reduce the divergence in the x direction to a limited range of angles, e.g., 30°, while preferably maintaining a substantially Lambertian fall-off within a substantial portion of that limited range. Divergence in the other direction, the y direction, is preferably not reduced by the narrow field-of-view reflector 36. However, the Lambertian fall-off in this direction is preferably preserved.

This restriction in field-of-view is accompanied by a corresponding increase in pixel intensity in that direction. The intensity is enhanced by conserving of etendue within the optical element. Essentially, the pair of narrow-field-of-view reflectors 36 together form a non-imaging optical element that efficiently couples light having a wide field of view into a narrow field of view in the x direction. This design is especially useful for pixel displays 10 that are viewed from a limited range of vertical angles. By concentrating emission in that particular direction, the optical output of the LEDs 30 can be most efficiently exploited.

In one preferred embodiment, an optically transmitting material such as a polymer is filled between the two narrow field-of-view reflectors 36. This transparent polymer may be shaped to pass a beam emitted by the LED 30 that propagates through the Lambertianizing cup 48 and the narrow field-of-view reflectors 36 with minimal alteration. Preferably, however, the transmitting material has a surface that is shaped into a lens, the beam-shaping lens 38, that is situated above the narrow field-of-view reflector 36 to add further beam-tailoring. This lens 38 may be a conventional refractive element with spherical or aspheric shape to provide beam bending. This lens 38 may be a separate element positioned above the reflective optics 34, 36 or may be formed integral therewith especially in the case where a transparent material is inserted between the two narrow field-of-view reflectors to form a dome, the surface of which is appropriately shaped. Injection molding or stamping may be suitably employed to fabricate this lens 38.

In one embodiment, the beam-shaping lens 38 has an ellipsoidal surface that corrects the beam exiting the narrow field-of-view reflector 36 for conformance with Lambert's Law. To design the lens 38 for a particular LED, measurements of the fall-off of intensity of the LED with angle are performed for the respective red, blue, or green miniature optical systems with accompanying beam-shaping optics 32 having a hemispherical dome. If the intensity as a function of angle θ falls off faster than cos θ, then the dome should be made ellipsoidal with the curvature in the x direction having a radius of curvature that is longer than the radius of the hemisphere. Similarly, if the intensity falls off less quickly than cos θ, the dome should be made ellipsoidal with a curvature in the x direction that is shorter than the radius of the hemisphere. Separate measurements are preferably made for each of the red, blue, and green LEDs, and the respective lens 38 are individually tailored for each color. The blue and green LEDs may, however, have intensity patterns that are sufficiently similar such that the miniature optical systems for the two are substantially identical.

By customizing the miniature optical systems 32 for the separate color LEDs 30, the fall-off of each can be made the same. Accordingly, color distortion that results when the colors in the display fall off at different rates can be avoided by employing the individualized miniature beam-shaping optics 32 described above. A Lambertian fall-off is thus provided for each color in both the x and y directions with the exception that the field-of-view in the vertical direction is limited, e.g., to ±30°, while the field-of-view in the horizontal direction will not be so restricted and may be as large as about ±90°.

The theoretical performance of the Lambertianizing cup 48 and narrow field-of-view reflectors 36 is shown in FIG.

17, which is a plot that depicts how intensity output from the miniature optical system 28 falls off with angle in directions along the x and y axes. The fall-off in the x and y directions in characterized by curves 68 and 70. The ideal Lambertian cosine fall-off and the ideal narrow-field-of-view cut-off correspond to curve 72 and curve 74, respectively. The restriction imposed on the field-of-view in the x direction by the narrow field-of-view optics 36 is clearly demonstrated by the cut-off of curve 68. In contrast, the fall-off in the y direction is relatively gradual, roughly falling off in a Lambertian fashion. Curves 68 and 70, however, do not perfectly mimic the cosine fall-off shown in curve 72 and curve 74. Proper design of the beam-shaping lens 38, which is intended to supplement the wide and narrow field-of-view reflectors 34, 36, however, is expected to adequately correct the beam in accordance with Lambert's Law.

Thus, by outfitting the LEDs 30 in the pixels 18 with miniature intensity-enhancing optical system, i.e., beam-shaping optics, 32 emission can be restricted in the vertical field-of-view, while providing a Lambertian intensity dependence throughout an unrestricted horizontal view. For example, the field-of-view in the vertical direction may be limited to about ±30° while the field-of-view is about ±90° in the horizontal direction. In addition, employing the Lambertianizing cup 48 minimizes the amount of light emitted by the sides 44 of the LED 30 that is misdirected and/or absorbed. Some green and blue LEDs, as well as transparent-substrate red LEDs, in particular, have significant side-emission, which wastes light and precludes a Lambertian intensity pattern. The Lambertian cup 48 can thus be advantageously used to enhance pixel intensity especially in these cases.

A separate Lambertianizing cup 48, narrow field-of-view reflectors 36 and beam-shaping lens 38 are preferably arranged into a separate miniature intensity-enhancing optical system 32 for each red, green, or blue die in a given pixel. By including the LEDs 30 in separate packages with separate beam-shaping optics 32, the pixels 18 are not power-limited by having the entire triad in one package, a configuration that inhibits heat-dissipation. Such heat-dissipation, which becomes increasingly necessary when scaling up the display size, is more readily achieved by individually packaging the red, green, and blue LEDs.

Also, individually tailoring this miniature intensity-enhancing optical system 32 for each model of the red, green, and blue die 30, prevents slight differences in design between the red and the blue/green systems from affecting the performance of the display. With the appropriate optics 32, all three pixel-colors will possess the same Lambertian fall-off, and will thus satisfy a critical condition for chrominance conservation (i.e., hue invariance) in the display's color balance across all viewing angles.

Another advantage of the foregoing LED pixel design for large-scale displays 10 is the relatively low cost of these video pixels 18 that provide restricted-Lambertian intensity output. A high-definition display for digital cinema likely will have at least 1800 by 1025 color triads, about 5.5 million LEDs, so that each additional cent of pixel cost adds about $55,000 to the display price. The LED pixel 18 comprising a plurality of miniature intensity-enhancing optical systems 32, one for each color LED, even with suitably precise miniature fabrication, minimally impacts pixel price. Thus, low cost is yet one more advantage for employing these optical systems.

Although the beam shaping optics 32 have been described in connection with a video display 10, LED light sources that employ this type of optical system to produce an asymmetric distribution may find wide applicability. These light sources may be particularly well suited for automotive lighting, such as for example in taillights or light for illuminating license plates. These systems may also find use in manufacturing processes where they may function, for example, as light sources employed in UV curing. Medical treatments such as phototherapy may also benefit by exploiting the advantages offered by these light sources.

Other applications for the beam-shaping optics 32 are also considered possible, the relevant applications not being limited to those specifically recited above. Furthermore, the present invention may be embodied in other specific forms without departing from the essential characteristics as described herein. The embodiments described above are to be considered in all respects as illustrative only and not restrictive in any manner.

What is claimed is:

1. A color display comprising a plurality of pixels, each pixel comprising a plurality of light sources, each of said light sources comprising a solid-state emitter that emits light of a color different from other of said light sources, and each of said light sources including optics such that intensity variations with respect to view angle are substantially the same as other of said plurality of light sources;

wherein said light sources each comprise a light-emitting diode; and wherein said optics for at least two of said light-emitting diodes in each of said pixels are dissimilar.

2. A color display of claim 1, wherein said optics have a configuration such that intensity variations with respect to view angle are substantially the same for each of light sources within said color display.

3. The color display of claim 1 wherein said optics comprise optical surfaces and wherein said surfaces for at least two of said light-emitting diodes in said pixels have substantially dissimilar curvatures.

4. A color display comprising a plurality of pixels each comprising a plurality of light sources, wherein said light sources each comprise a light-emitting diode and beam-shaping optics;

wherein said beam-shaping optics for at least two of said light-emitting diodes in each of said pixels are dissimilar.

5. The color display of claim 4, wherein said plurality of light sources are arranged linearly along a first direction within said pixel and said beam-shaping optics comprise reflective elements that reduce divergence of light to a limited range of angles in said first direction in comparison with divergence of light in a second orthogonal direction.

6. The color display of claim 5, wherein said beam-shaping optics comprises reflective optics shaped to provide a substantially cosine fall-off in said first direction.

7. The color display of claim 5, wherein said beam-shaping optics comprises refractive optics shaped to provide a substantially cosine fall-off in said second orthogonal direction and a substantially cosine fall-off in said first direction within said limited range of angles.

8. The color display of claim 5, wherein said first direction comprises a vertical direction and said second direction comprises a horizontal direction.

9. The color display of claim 8, wherein said reflective elements are shaped so as to restrict the divergence of light in said vertical direction to a range of angles spanning about 60°.

10. A color display comprising a plurality of pixels each comprising a plurality of substantially Lambertian sources, each Lambertian source comprising a light-emitting diode that emits light of a color different from other of said Lambertian sources in said pixel and optics situated to receive light from said light-emitting diode and configured to redirect said light into a Lambertian output;

wherein said optics for at least two of said light-emitting diodes in each of said pixels are dissimilar.

11. The color display of claim 10, wherein said optics comprise a Lambertianizing cup comprising a plurality of reflectors shaped to distribute said light from said source in conformance with Lambert's Cosine Law.

12. The color display of claim 11, further comprising reflectors that restrict divergence of said light in the one direction.

13. An apparatus comprising a light source which emits light for viewing at various angles, said light source comprising:

an LED having a front surface, a back surface opposite said front surface, and four side surfaces, wherein said front surface and said four side surfaces emit light and wherein said front surface and said four side surfaces intersect along four upper edges, respectively; and a Lambertianizing cup comprising a bottom surface and four reflector surfaces, one facing each of said four side surfaces of said light-emitting diode, at least one opposed pair of said reflector surfaces configured to provide a substantially cosine fall-off of light intensity as the viewing angle deviates from a viewing direction extending from the light source in a plane perpendicular to said side surfaces of said LED that said pair of reflector surfaces face;

wherein said reflector surfaces substantially coincide with a locus of points intersecting an arc that is translated along a line parallel to said upper edge of each of said four sides of said LED.

14. The apparatus of claim 13 wherein said arc is formed from a circle having a center on said upper edge.

15. The apparatus of claim 14, wherein said circle has a radius at least as long as a distance that separates said front surface from said back surface of said cup.

16. The apparatus of claim 15, wherein each of said reflector surfaces has one end that approaches said back surface of said cup.

17. The apparatus of claim 16, wherein each of said reflector surfaces has another end that extends to a plane containing said front surface of said LED.

18. The apparatus of claim 17, wherein each of said four reflector surfaces contacts two other reflector surfaces, thereby forming four seams in said Lambertianizing cup.

19. A nonimaging optical element comprising:

first and second reflectors positioned in spaced, facing relationship, each reflector comprising:

a middle section comprising a surface in the form of a parabolic cylinder which has a line focus; and two end sections on opposite sides of said middle section, each end section comprising a surface that joins the surface of the middle section along a parabolic line, said surface of each end section in the form of a paraboloid with a point focus, the point focus of each end section proximate a respective end of said line focus of said middle section, wherein the middle sections of the first and second reflectors form a compound parabolic concentrator trough, which together with the end sections of the reflectors provide beam-shaping optics for restricting beam divergence in one of two orthogonal directions.

20. Beam-shaping optics for shaping a beam emitted from a light-emitting diode, said optics comprising:

(a) a first set of reflectors positioned adjacent to sides of said light-emitting diode;

(b) a second set of reflectors oriented to limit beam divergence of light from said light-emitting diode to a limited range of angles in one plane, the second set of reflectors comprising:

first and second reflectors positioned in spaced, facing relationship, each reflector comprising:

a middle section comprising a surface in the form of a parabolic cylinder which has a line focus; and two end sections on opposite sides of said middle section, each end section comprising a surface that joins the surface of the middle section along a parabolic line, said surface of each end section in the form of a paraboloid with a point focus, the point focus of each end section proximate a respective end of said line focus of said middle section, wherein the middle sections of the first and second reflectors form a compound parabolic concentrator trough, which together with the end sections of the reflectors provide beam-shaping optics for restricting beam divergence in one of two orthogonal directions; and (c) an optical element comprised of transmitting material positioned to receive light from said light-emitting diode and said first and second sets of reflectors, wherein said sets of reflectors and transmitting material are oriented and configured to provide a substantially Lambertian fall-off for light intensity in said one plane within said limited range of angles and a substantially Lambertian fall-off for light intensity in an orthogonal plane within a range of angles greater than said limited range of angles.

21. A method of manipulating light emitted from a light-emitting diode to provide a light source that substantially obeys Lambert's cosine-law through a range of viewing angles, said method comprising the steps of:

collecting light emitted from plural side surfaces of a light-emitting diode and redirecting said light so that the light emitted by the light source approximates light emitted by a single Lambertian surface;

reducing the divergence of collected light in a plane orthogonal to an opposing pair of said plural sides by guiding the collected light through first and second reflectors positioned in spaced, facing relationship, each reflector comprising:

a middle section comprising a surface in the form of a parabolic cylinder which has a line focus; and two end sections on opposite sides of said middle section, each end section comprising a surface that joins the surface of the middle section along a parabolic line, said surface of each end section in the form of a paraboloid with a point focus, the point focus of each end section proximate a respective end of said line focus of said middle section, wherein the middle sections of the first and second reflectors form a compound parabolic concentrator trough, which together with the end sections of the reflectors provide beam-shaping optics for restricting beam divergence in one of two orthogonal directions; and refracting collected light after reducing the divergence.

22. A method of shaping the output of a light-emitting diode having a front and a plurality of sides that emit light, said method comprising the steps of:

collecting light emitted from said sides and redirecting said light to simulate light produced by a single substantially Lambertian surface;

using reflectors to reduce the divergence of the beam in one direction to a limited range of angles while maintaining a substantially Lambertian fall-off within a substantial portion of said limited range, wherein the reflectors comprise first and second reflectors positioned in spaced, facing relationship, each reflector comprising:
- a middle section comprising a surface in the form of a parabolic cylinder which has a line focus; and
- two end sections on opposite sides of said middle section, each end section comprising a surface that joins the surface of the middle section along a parabolic line, said surface of each end section in the form of a paraboloid with a point focus, the point focus of each end section proximate a respective end of said line focus of said middle section, wherein the middle sections of the first and second reflectors form a compound parabolic concentrator trough, which together with the end sections of the reflectors provide beam-shaping optics for restricting beam divergence in one of two orthogonal directions.

* * * * *

UNITED STATES PATENT AND TRADEMARK OFFICE
CERTIFICATE OF CORRECTION

PATENT NO. : 6,603,243 B2
DATED : August 5, 2003
INVENTOR(S) : William A. Parkyn and David G. Pelka It is certified that error appears in the above-identified patent and that said Letters Patent is hereby corrected as shown below:

Title page,
Item [56], References Cited, OTHER PUBLICATIONS, delete "Ser. No. 091334,848 filed Jun. 10" and insert -- Ser. No. 09/334,848 filed Jun. 16 -- therefor.

Column 3,
Line 32, delete "fall-color" and insert -- full-color -- therefor.

Column 5,
Line 26, delete "an".
Line 66, after "these" delete "the".

Column 6,
Line 64, delete "44" and insert -- 34 -- therefor.

Column 7,
Line 47, delete "improves" and insert -- improve -- therefor.

Column 8,
Line 24, after "one" insert -- of --.

Column 9,
Line 40, after "shape" insert -- of --.

Column 11,
Line 4, delete "in" and insert -- is -- therefor.

Signed and Sealed this

Tenth Day of May, 2005

JON W. DUDAS
*Director of the United States Patent and Trademark Office*